United States Patent
Yokota et al.

(10) Patent No.: US 7,350,162 B2
(45) Date of Patent: Mar. 25, 2008

(54) STRUCTURE ANALYTIC PROGRAM

(75) Inventors: Morimichi Yokota, Oyama (JP); Toshihiro Suzuki, Oyama (JP)

(73) Assignee: Fujitsu Limited, Kawasaki (JP)

( * ) Notice: Subject to any disclaimer, the term of this patent is extended or adjusted under 35 U.S.C. 154(b) by 245 days.

(21) Appl. No.: 11/237,698

(22) Filed: Sep. 29, 2005

(65) Prior Publication Data
US 2006/0218202 A1   Sep. 28, 2006

(30) Foreign Application Priority Data
Mar. 28, 2005   (JP) ............... 2005-093281

(51) Int. Cl.
  G06F 17/50   (2006.01)
  G06F 9/45   (2006.01)
(52) U.S. Cl. .................. 716/1; 716/3; 716/5
(58) Field of Classification Search ............ 716/1, 716/3, 5
  See application file for complete search history.

(56) References Cited

U.S. PATENT DOCUMENTS 6,345,378 B1 *   2/2002   Joly et al. ............ 716/2
7,155,687 B2 *  12/2006   Cheung et al. ............ 716/3
7,188,162 B1 *   3/2007   Fredriksson et al. ....... 709/221
2004/0139408 A1 *  7/2004   Boluki et al. .............. 716/5

FOREIGN PATENT DOCUMENTS

JP   9-311882   12/1997
JP   2003-216672   7/2003

* cited by examiner

*Primary Examiner*—Thuan Do
*Assistant Examiner*—Magid Y. Dimyuan
(74) *Attorney, Agent, or Firm*—Staas & Halsey LLP

(57) ABSTRACT

A structure analytic program is used to direct a computer to perform a process of analyzing the structure of a HDL data circuit, and efficiently analyzes a design product relating to a circuit design using a hardware description language (HDL) with the configuration including: an acquiring process of obtaining the circuit design data; a database structuring process of structuring a structure analyzing database based on the circuit design data; a replicating process of replicating the structure analyzing database; an element deleting process of deleting a predetermined element in the elements configuring the hardware description language data indicated by the replicate database from the replicate database that is the replicated structure analyzing database; and a structure analyzing process of performing the structure analysis on the replicate database from which the element is deleted in the element deleting process.

15 Claims, 29 Drawing Sheets

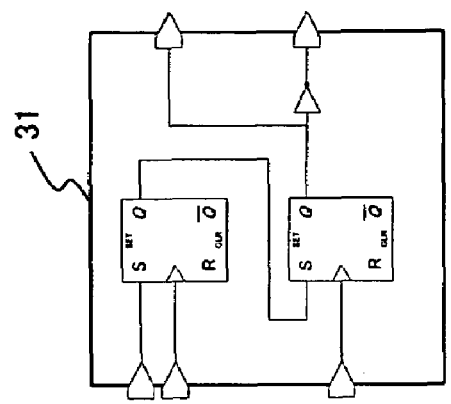
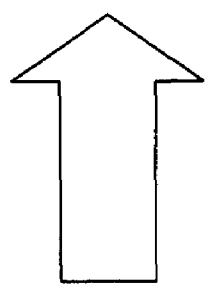
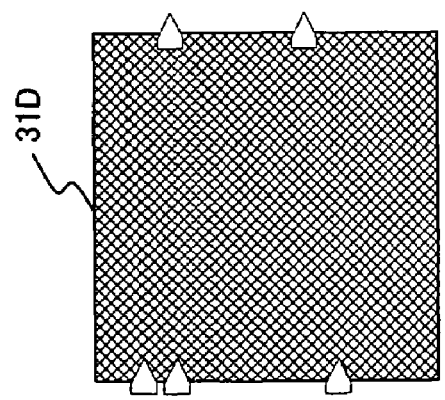
FIG. 20

COMPSITION CONDITION EXAMPLE

1. THERE ARE THREE INPUT DATA SIGNALS.
2. ONE OF INPUT DATA IS CONSTANT VALUE 'Z'.
3. USING 'Z' DOES NOT REFER TO CONDITIONAL EXPRESSION.
4. THERE IS ONE OUTPUT DATA SIGNAL..

COMPOSITION RULE DESCRIPTION EXAMPLE (TCL LANGUAGE)

```
set literals [search_litelal -value Z]                    # CONDITION 2.
foreach ZLiteral $literals {
    set node [trace_forward -node $ZLiteral]
    set InputDataNumber [get_input_node -node $node]
    if {$InputDataNumber != 3} { return }                 # CONDITION 1.
    set CondNode [get_condition -node $ZLiteral]
    if { $CondNode != 0 && $CondNode != ZLiteral } {      # CONDITION 3.
        set OutDatas [get_output_node -node $node]
        if { [llength $OutDatas != 1} { return }          # CONDITION 4.
    }
}
# COMPOSITION CONDITION CONFIRMATION COMPLETION,
# AFTERWARDS, GENERATION OF TRI-STATE BUFFER AND
# CONNECTING PROCESS

STRUCTURE ANALYTIC PROGRAM

CROSS-REFERENCE TO RELATED APPLICATIONS

This application is based upon and claims the benefit of priority from the prior Japanese Patent Application No. 2005-093281, filed on Mar. 28, 2005, the entire content of which are incorporated herein by reference.

BACKGROUND OF THE INVENTION

1. Field of the Invention

The present invention relates to the structure analysis of the design data of the HDL.

2. Description of the Related Art

In generating the conventional LSI, a developer normally generates an RTL (register transfer level) using the HDL (hardware description language), generates an analyzing DB, and composing a logic about the analyzing DB, thereby generating an LSI. The structure analysis in the above-mentioned generating process consumes a lot of computer resources. Therefore, it is possibly necessary to take measures by dividing a target LSI and composing a logic, etc.

When an error is detected, the HDL designed product is amended and the structure analysis is performed again. Therefore, a long time and a number of process steps are required. Recently, with a larger scale LSI, the restrictions on the computer resources (memory, etc.) used in the structure analysis have caused the necessity to take measures by dividing an HDL designed product in performing the structure analysis.

In Japanese Published Patent Application No. 2003-216672, an asynchronous path analysis can be easily performed and the time required to compose a logic can be shortened in the semiconductor circuit design of an LSI. In Japanese Published Patent Application No. 2003-216672, the circuit data of the RTL description is read, an asynchronous path in the circuit is detected based on the circuit data of the RTL description, an array is extracted from the detected asynchronous path, the arrays of asynchronous paths are collectively displayed, an asynchronous path is selected as a false path, an asynchronous path corresponding to a false path is deleted from the target of the optimization of a circuit, and a circuit at a gate level is generated from the circuit data of the RTL description.

In Japanese Published Patent Application No. Hei 09-311882, the portion of the RTL HDL description to be logically verified is extracted and optimized, and the speed of the simulating process can be increased. In Japanese Published Patent Application No. Hei 09-311882, the RTL HDL description is analyzed and the logical converting process and the register generating process are performed, thereby converting the RTL HDL description to a network list. Then, an observation point of the logical circuit and an input point to be fixed as a constant in the input points are specified. Then, reference and tracing of a propagation relation are performed to downsize the circuit. Furthermore, residual registers that are not intended for observation are moved and integrated for further optimization. Afterwards, a redundant logic is optimized, and then the optimized network list is converted attain to the RTL HDL description, and a simulation pattern is amended depending on the optimization.

FIG. 1 shows an analyzing procedure of the conventional analyzing process. In the analyzing process, a master DB 201 is first generated from an HDL design document 200. Then, an analyzing process 203 is performed on the structured master DB 201, thereby obtaining analysis result data 204.

In the analyzing process 203, an element of a root is obtained from the master DB (1). It is described whether or not the analysis is required. If an analysis is required, the analysis process is performed, and a result is stored (2). An element of a child is obtained (An element of a parent is stored) (3). The processes (2) and (3) are repeated (4). These processes are repeated according to all elements.

However, when the above-mentioned analysis is performed in the conventional technology, the analyzing DB is very large. Therefore, it takes a long time to perform the analyzing process. Furthermore, with a lot of HDL designed data, the computer resources (memory, etc.) have been short. That is, in the conventional technology, there is no database optimized for the necessary analysis contents.

Additionally, when an error is detected, the RTL is to be amended, and it is necessary to regenerate the analyzing DB from the RTL. That is, when an error is detected, an HDL designed product is amended, and each time it is amended, the analyzing DB is restructured and an analysis is performed again. However, since the analyzing process requires a very long time, the operation cannot be efficiently performed because a common analysis system is specified for detection of an error, and a rearranging test cannot be conducted on an HDL designed product in the memory, thereby requiring repeated amendments to the design product and analyzing process.

Furthermore, there can be different composition rules depending on the logical composition tool, thereby different output results are obtained. That is, a circuit different from an analysis result can be generated.

SUMMARY OF THE INVENTION

The present invention intends to efficiently analyze a design program in designing a circuit using a hardware description language (HDL).

A computer readable storage medium for storing a structure analytic program used to direct a computer to perform process of analyzing a structure of a circuit of circuit design data relating to the circuit configured by a plurality of elements of a circuit described in a hardware description language according to the present invention, comprising:

an acquiring process of obtaining the circuit design data;

a database structuring process of structuring a structure analyzing database based on the circuit design data;

a database replicating process of replicating the structure analyzing database;

an element deleting process of deleting a predetermined element in the elements configuring the circuit indicated by the replicate database from the replicate database that is the replicated structure analyzing database; and a structure analyzing process of performing the structure analysis on the replicate database from which the element is deleted in the element deleting process.

Furthermore, a computer readable storage medium for storing a structure analytic program used to direct a computer to perform process of analyzing a structure of a circuit of circuit design data relating to the circuit configured by a plurality of elements of a circuit described in a hardware description language according to the present invention, comprising:

an acquiring process of obtaining the circuit design data including a portion not yet designed;

a dummy module generating process of generating the portion not yet designed as a dummy module;

a first database structuring process of structuring a structure analyzing database based on the circuit design data in the dummy module generating process;

an element replacing process replacing the dummy module with a normal module whose design is complete; and a second database structuring process of structuring a structure analyzing database based on the replacing module; and a structure analyzing process of performing the structure analysis on the analyzing DB.

The structure analytic apparatus according to the present invention for analyzing the structure of a circuit of the circuit design data relating to the circuit configured by a plurality of elements of a circuit described in a hardware description language includes:

an acquisition unit for obtaining the circuit design data;

a database structure unit for structuring a structure analyzing database based on the circuit design data;

a database replicate unit for replicating the structure analyzing database;

an element deletion unit for deleting a predetermined element in the elements configuring the circuit indicated by the replicate database from the replicate database that is the replicated structure analyzing database; and a structure analysis unit for performing the structure analysis on the replicate database from which the element is deleted in the element deleting process.

BRIEF DESCRIPTION OF THE DRAWINGS

FIG. 20 shows replacement of a dummy module 31D with a normal module 31 according to the second embodiment;

FIG. 26 shows a description example (44) of a composition rule according to the third embodiment;

DESCRIPTION OF THE PREFERRED EMBODIMENTS

Figure 1:
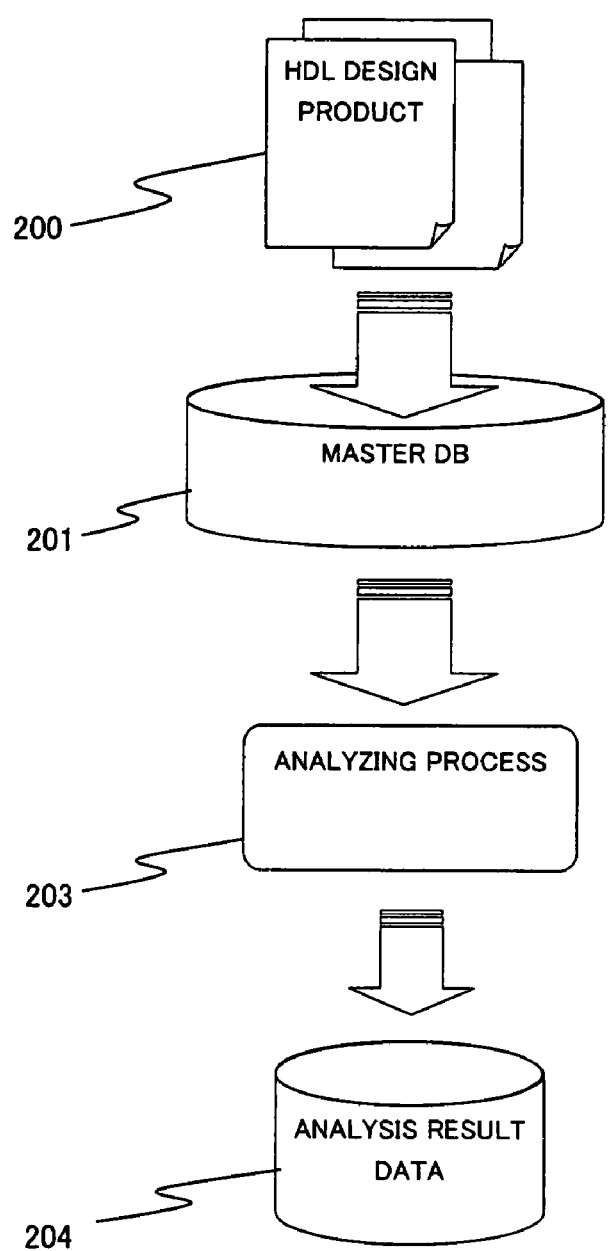
FIG. 1 shows an analyzing procedure of the conventional analyzing process.
Figure 2:
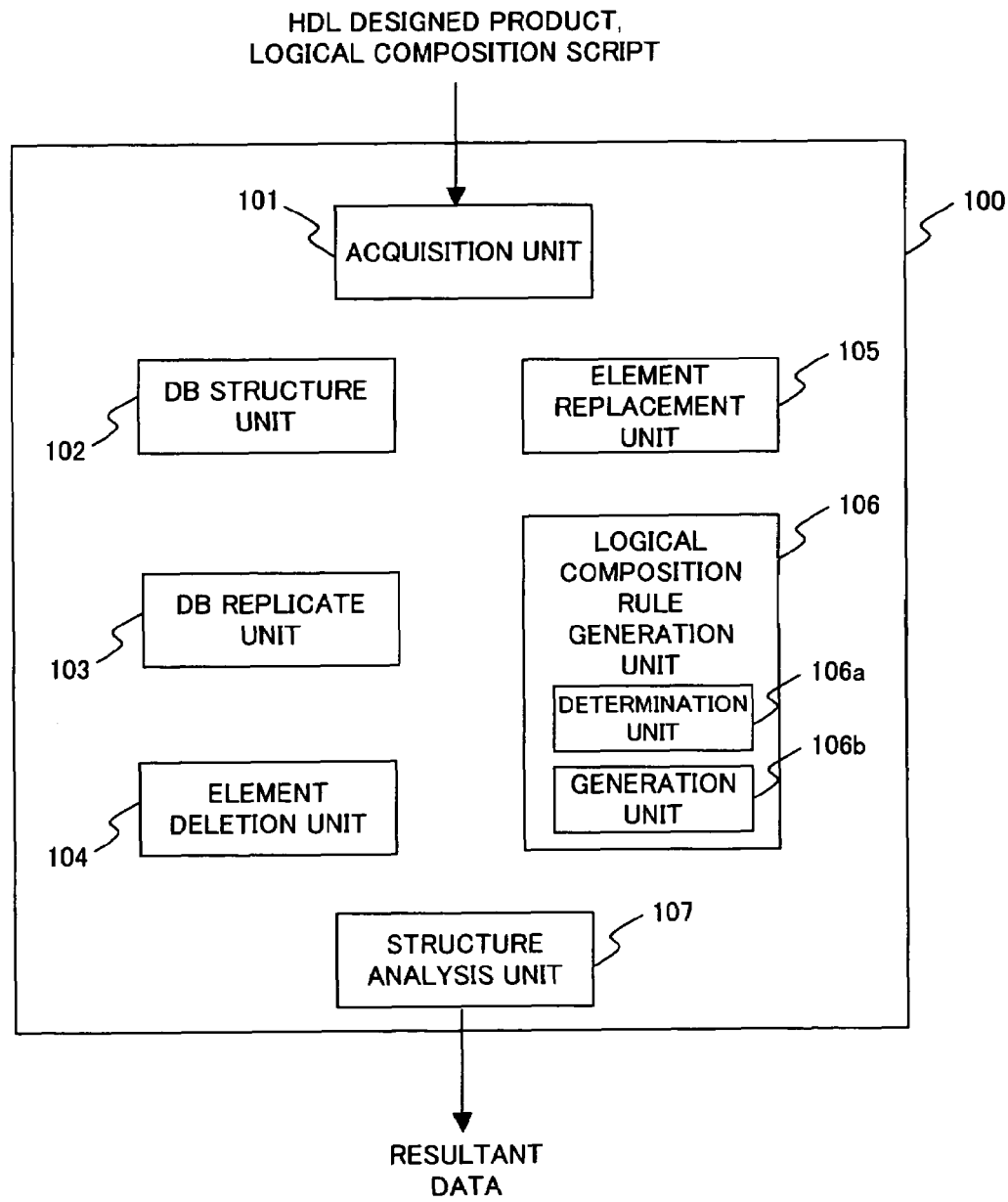
FIG. 2 shows the concept of the configuration of an HDL data structure analysis system 100 according to the present invention.

FIG. 2 shows the concept of the configuration of the HDL data structure analysis system 100 according to the present invention. The HDL data structure analysis system 100 is, for example, a computer storing a program for performing a structure analysis on the design data described in the hardware description language (hereinafter referred to as the HDL), and the program is read by a control device, and executes the flow explained in the following first through third embodiments.

The HDL data structure analysis system 100 comprises an acquisition unit 101, a DB structure unit 102, a DB replicate unit 103, an element deletion unit 104, an element replacement unit 105, a logical composition rule generation unit 106, and a structure analysis unit 107.

The acquisition unit 101 obtains the design data (HDL designed product) described in the HDL generated by a user. The acquisition unit 101 also obtains a script for logical composition defined by a user.

The DB structure unit 102 generates a database for an analysis of the description at a language level. The DB replicate unit 103 replicates the DB to optimize and analyze the DB (database) depending on the type of structure analysis.

The element deletion unit 104 deletes residual elements other than the necessary information from the replicated DB, thereby saving the computer resources (memory, etc.) and the processing time by deleting excess elements. Thus, large amount of design data can be analyzed. The structure analysis unit 107 performs a structure analysis (for example, checking the status of the connection between elements configuring a circuit, checking the routing between ports, checking the status of line connections, etc.) on the circuit configuration relating to the DB structured as described above.

Furthermore, the element replacement unit 105 generates a database for an analysis of the description at a language level from the design data described in the HDL, and then enables a specified pattern element to be replaced (exchanged). The element replacement unit 105 also comprises a unit for outputting the replacement information.

The logical composition rule generation unit 106 generates a database for analysis of the description at a language level from the design data described in the HDL, and then enables a logical composition rule (for example, register/selector, etc.) to be replaced (exchanged).

The logical composition rule generation unit 106 has a determination unit 106a and a generation unit 106b. The determination unit 106a determines whether or not there is an element satisfying the condition described in the logical composition rule. The generation unit 106b generates a new element based on the logical composition rule, and converts the element obtained by the determination in the determining process to a new element.

According to the first embodiment of the present invention, when a structure analyzing database (DB) is structured, the optimization can be realized by deleting information unnecessary for the analysis, thereby realizing the reduction of memory consumption and the improvement of the analyzing process.

In the conventional analyzing process, the following process is performed, and the consumption of the resources except in the analyzing process. However, the resources required for analysis are much more than in the new system described later.

Figure 3:
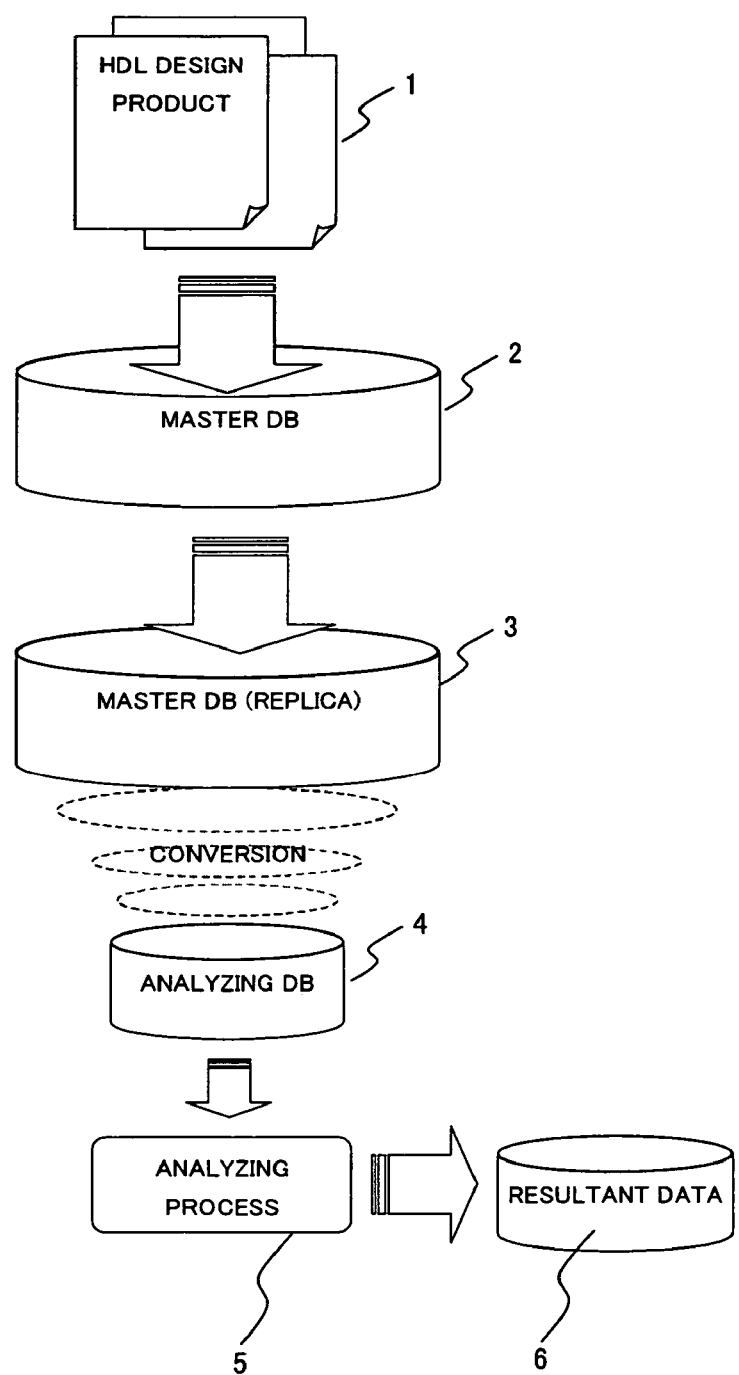
FIG. 3 shows the analyzing procedure using the optimized DB according to the first embodiment.

FIG. 3 shows the analyzing procedure using the optimized DB in the first embodiment. First, a user generates the HDL design document 1 using predetermined software, and the HDL design document 1 is input to the HDL data structure analysis system 100. Then, the control device in the HDL data structure analysis system 100 performs the following DB structuring process and the analyzing process.

[DB Structure]

1. A master DB 2 is generated from an HDL design document 1.

2. The master DB 2 is replicated.

3. The master DB (replica) 3 is converted to an analyzing DB 4 by deleting an unnecessary element from the master DB (replica) 3 and performing optimization.

4. An analyzing process 5 is performed on the analyzing DB 4 to obtain resultant data 6. The following operations are performed in the analyzing process 4.

[Analyzing Process]

4-1. An element as a root is obtained from the analyzing DB 4.

4-2. An analyzing process (for example, checking the status of the connection between elements configuring a circuit, checking the routing between ports, checking the status of line connections, etc.) are performed and a result is stored.

4-3. An element as a child is obtained (an element as a parent is stored).

4-4. The above-mentioned operations 4-2 through 4-3 are repeated.

Thus, the reduction of memory consumption and the improvement of the analyzing process can be performed by generating each optimized analyzing DB corresponding to the analyzing process.

When a structure analysis is performed on an analyzing DB, the analyzing DB is simplified depending on the purpose of the structure analysis, thereby reducing the required resources for the analyzing DB for each analysis and realizing a high-speed process. In the first embodiment, relating to the register in the analyzing DB, there are a method of generating an analyzing DB specialized for an asynchronous path, and a method of generating an analyzing DB specialized for a signal between blocks.

In the second embodiment of the present invention, although there is a block (module) of a portion not yet designed, it can be replaced with a dummy module. Thus, the connection status between blocks can be confirmed. Furthermore, since the status of line connections about generated blocks can be confirmed at an early stage, the design of a circuit can be efficiently performed.

Figure 4:
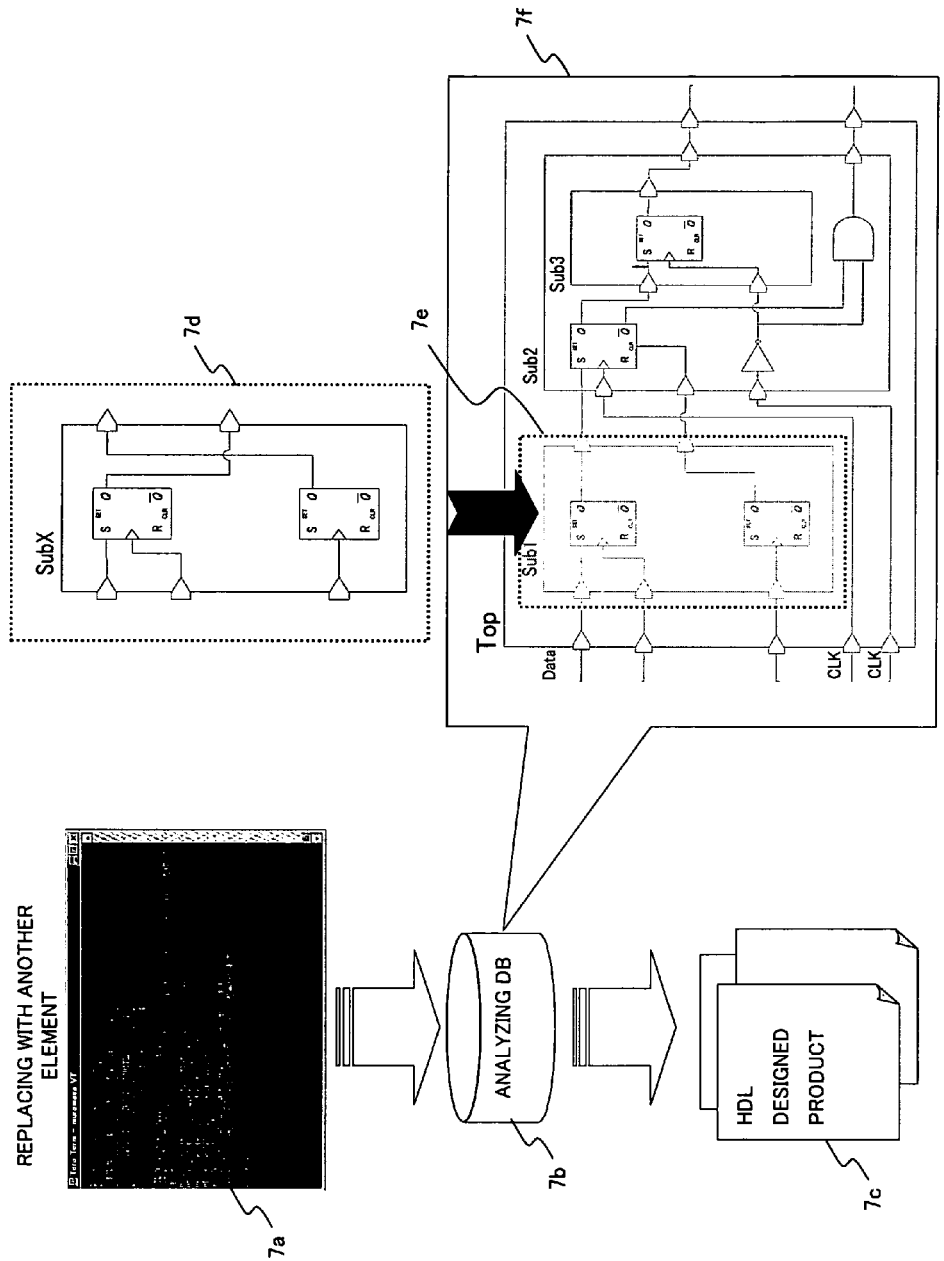
FIG. 4 shows the replacement of an element (module) in a circuit with another element (module) according to the second embodiment.

FIG. 4 shows exchanging an element (module) in a circuit according to the second embodiment with another element (module). In FIG. 4, when a block Sub 1 has not been designed yet, the block is incorporated into a circuit 7f as a dummy module 7e, and the status of structuring an analyzing DB is shown. When the portion not yet designed is completely designed, the completed Sub X replaces the dummy module.

In the second embodiment, an error detected by an analysis is immediately changed by allowing an analyzing DB 7b to be externally (user interface 7a (hereinafter referred to as a UI)) operated (changing/adding/deleting an element). Additionally, by storing a link to an HDL designed product in the master DB, an HDL designed product 7c corresponding to an amendment can be output.

According to the third embodiment of the present invention, the logical composition rule of an analyzing database can be changed from the UI. Thus, a specific pattern on the database can be replaced with a user-defined element, thereby performing a more flexible analysis.

Figure 5:
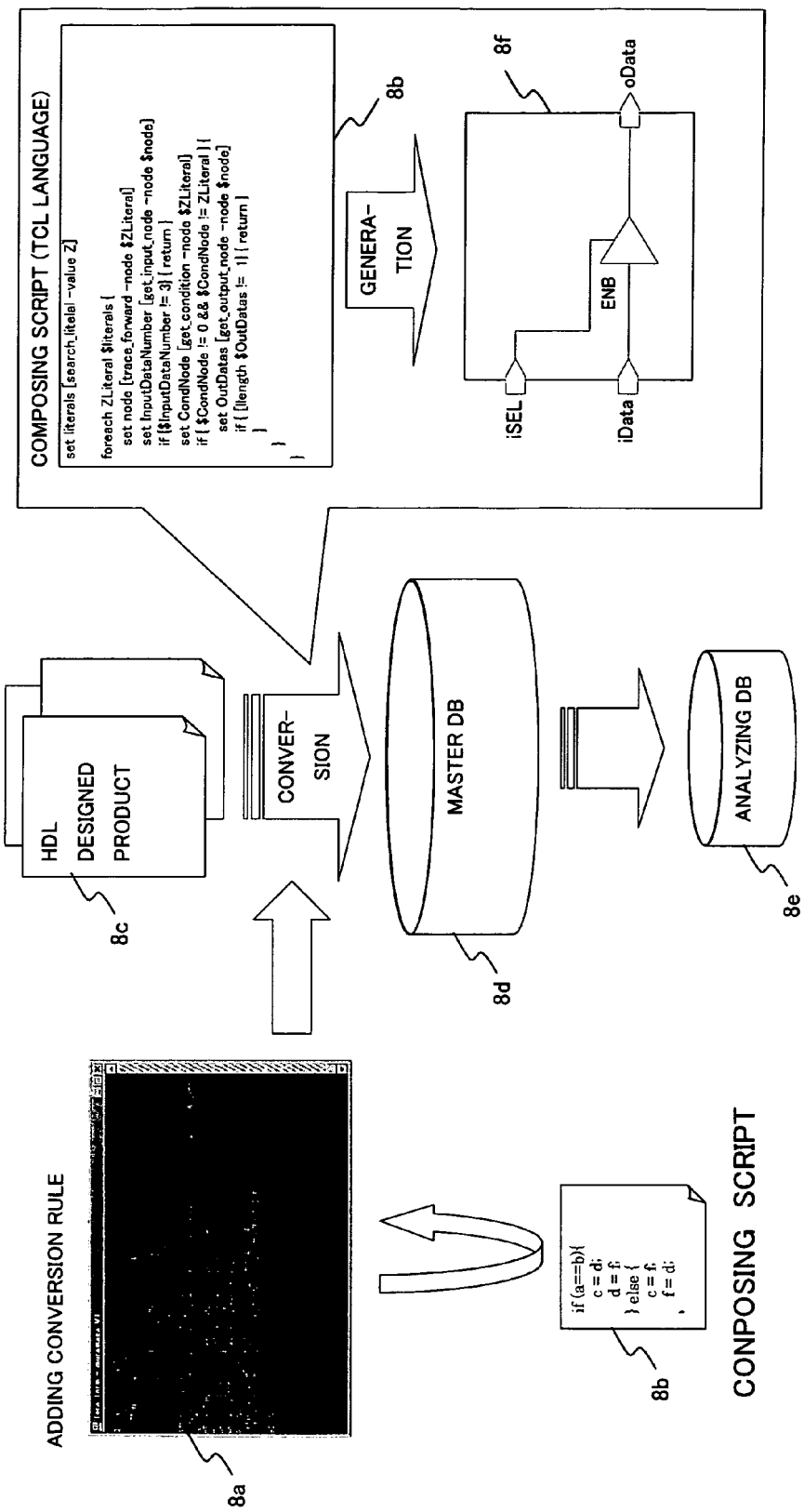
FIG. 5 shows adding a logical composition rule and converting it to a user-defined module according to the third embodiment.

FIG. 5 shows adding a logical composition rule and converting it to a user-defined module according to the third embodiment. In FIG. 5, a user generates a script for logical composition, and inputs it to the HDL data structure analysis system 100 through a UI 8a.

In the HDL data structure analysis system 100, when a master DB is structured from an HDL designed product 8c, and if any circuit configuration in the HDL designed product 8c satisfies the logical composition rule described in a script 8b, the logical composition rule is reflected by a master DB 8d. Then, an analyzing DB 8e is generated from the master DB 8d, and a structure analysis is performed.

Thus, by allowing the logical composition rule of the analyzing DB 8e to be externally (UI 8a) operated (changing/adding/deleting an element), the logical composition of a user unique specification can be realized.

Described below is each embodiment of the present invention. In the following explanation, analyzing the structure of HDL data is referred to as an analyzing process.

First Embodiment

In the present embodiment, the design data described in the HDL is input, a DB specialized for each analysis from master data at a previous stage in the logical composition is dynamically generated, thereby extracting information and detecting an error at a high speed.

In the present embodiment, by using an analyzing DB obtained by deleting an unnecessary element from the replicated master DB, the memory consumption in the analyzing process can be suppressed and the analyzing process can be improved.

There are plural types of structure analysis of a circuit configuration. However the structure analysis has unnecessary information or necessary information for each analyzing process. Therefore, when an analyzing process is performed, unnecessary information for the analyzing process is deleted in advance, and the optimized analyzing DB for the analyzing process is structured. In the following process, the optimized analyzing DB is generated by referring to asynchronous path retrieval and inter-block signal information extraction.

(Embodiment 1) in case where asynchronous path retrieval is performed

Asynchronous path retrieval refers to retrieving a register connected to a different clock signal source.

Figure 6:
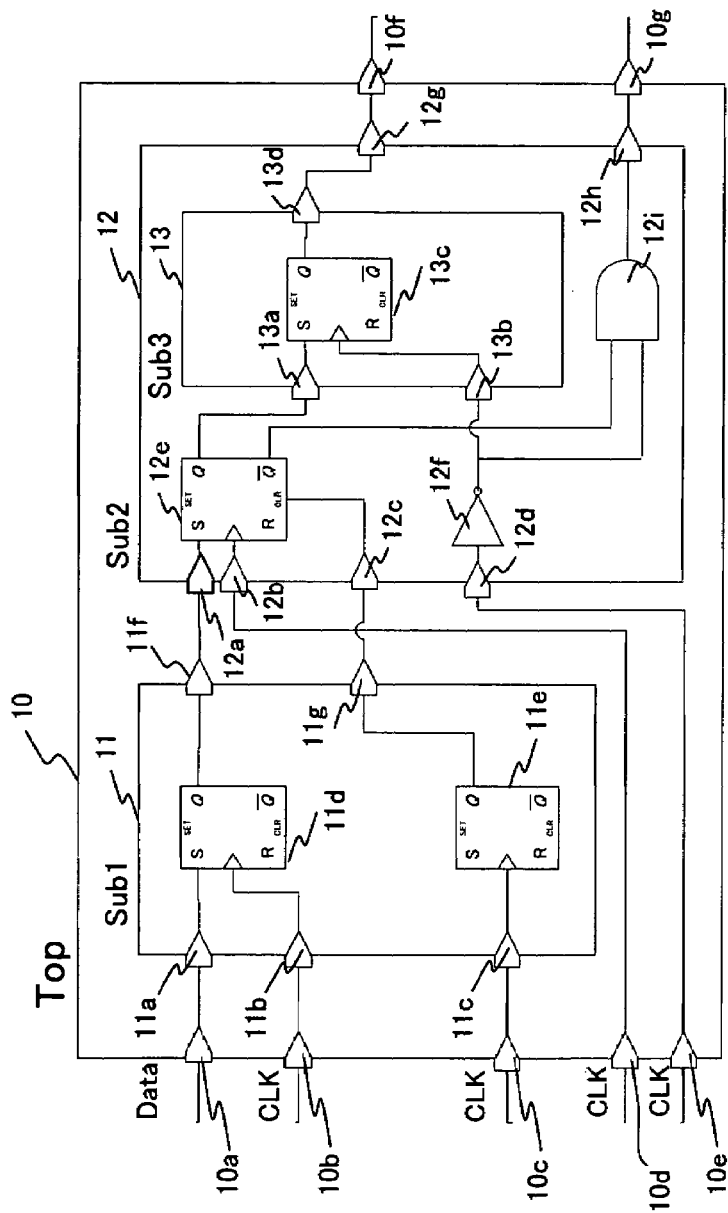
FIG. 6 shows an example of a circuit configuration including all information in the replicated master DB in the embodiment 1 according to the first embodiment.
Figure 7:
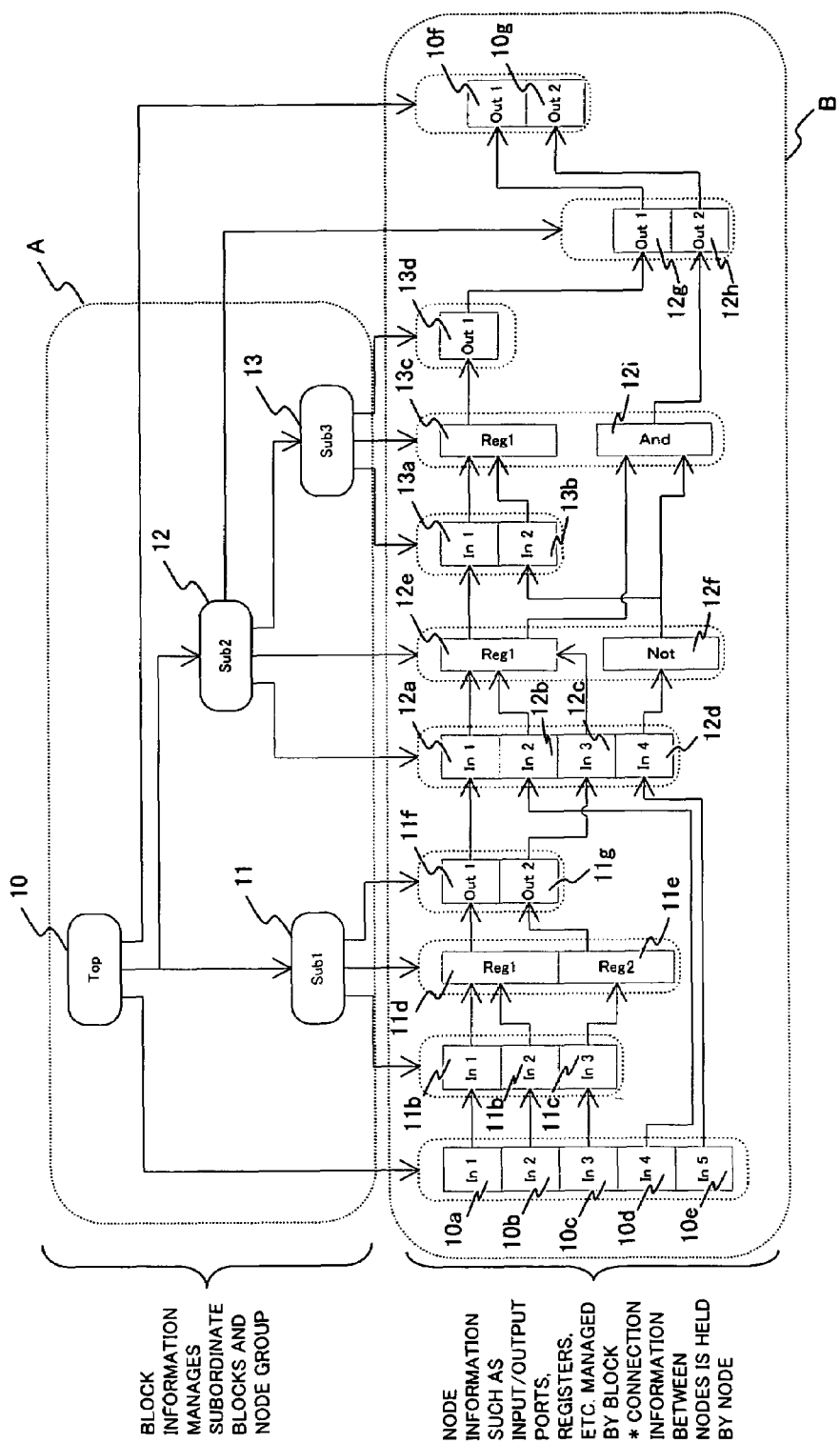
FIG. 7 shows the configuration of the circuit configuration shown in FIG. 6.

FIG. 6 shows an example of a circuit configuration including all information in the replicated master DB in the embodiment 1 according to the present embodiment. FIG. 7 shows the concept of the circuit configuration shown in FIG. 6. In the present embodiment, the concept of the circuit configuration in the highest order is represented by Top (10), and its subordinates are a block represented by Sub 1 (11) and a block represented by Sub 2 (12). A subordinate to the Sub 2 (12) is a block Sub 3 (13). Each block information manages a block subordinate to the current block and the information about a node group ('A' shown in FIG. 7). 'B' shown in FIG. 7 indicates node information about an input/output port, a register, etc. managed by a block. The connection information between nodes is held by a node itself.

When the hierarchy of blocks is designed using an HDL, a block is generated using a class. Therefore, Sub 1 (11), Sub 2 (12), and Sub 3 (13) are instances of the class.

The information managed by the Top (10) is the information including the blocks of the Sub 1 (11) and Sub 2 (12) subordinate to the Top, and the information about the input ports of In 1 (10a), In 2 (10b), In 3 (10c), In 4 (10d) and In 5 (10e), and the output ports of Out 1 (10f) and Out 2 (10g).

The information managed by the Sub 1 (11) is the information including a register 1 (11d) and a register 2 (11e) and the information about the input ports of the In 1 (11a), In 2 (11b), and In 3 (11c) and the output ports of the Out 1 (11f) and Out 2 (11g).

The information managed by the Sub 2 (12) is the information including the Sub 3 (13) subordinate to the Sub 2, and the information including the register 1 (12e), Not circuit (12f), AND circuit (12i), and the information about the input ports of In 1 (12a), In 2 (12b), In 3 (12c), and In 4 (12d), and the output ports of the Out 1 (12g) and Out 2 (12h).

The information managed by the Sub 3 (13) is the information including the register 1 (13c) and the information about the input ports of the In 1 (13a) and In 2 (13b) and the output ports of the Out 1 (13d).

When asynchronous path retrieval is performed, the connection information between blocks is unnecessary, and the information about the register to which a clock/data signal is connected will do. Therefore, the DB is changed as shown in FIG. 8.

Figure 8:
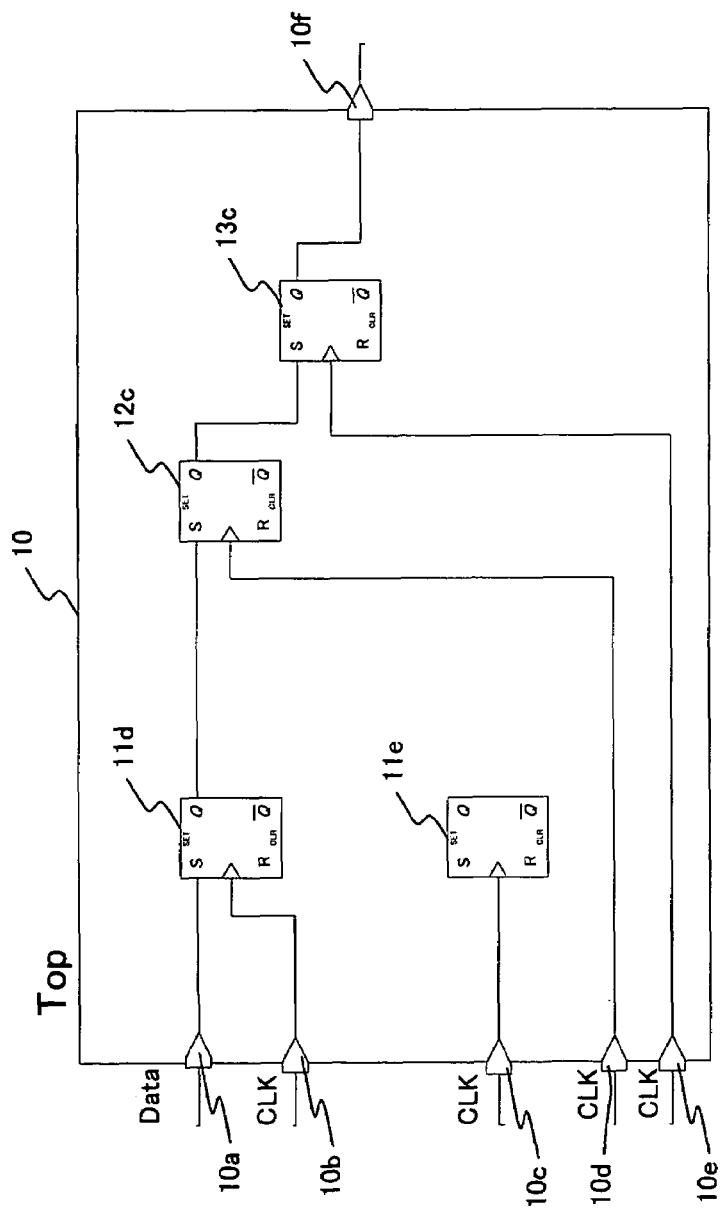
FIG. 8 shows the circuit configuration from which node information other than the register to which a clock/data signal is connected is deleted when an asynchronous path retrieval is performed in the embodiment 1 according to the first embodiment.
Figure 9:
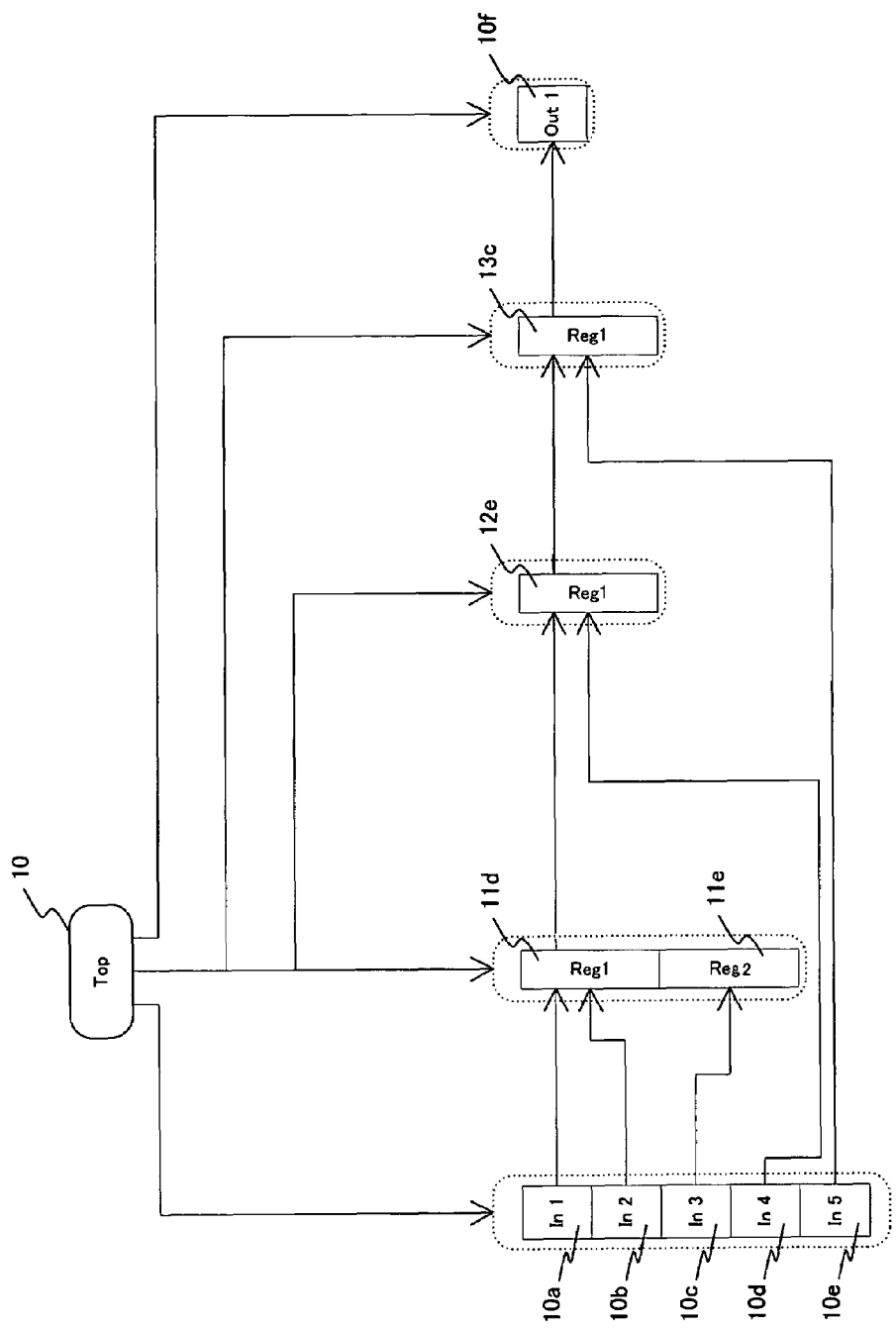
FIG. 9 shows the configuration of the circuit configuration shown in FIG. 8.

FIG. 8 shows the circuit configuration from which node information other than the register to which a clock/data signal is connected is deleted when an asynchronous path retrieval is performed in the embodiment 1 according to the first embodiment. FIG. 9 shows the concept of the circuit configuration shown in FIG. 8.

In FIGS. 8 and 9, the registers 11d, 11e, 12e, and 13c, the data signal input/output ports 10a, and 10f, clock signal terminals 10b, 10c, 10d, and 10e, the connection line between a clock signal terminals and a register, and the connection line between a data signal terminals and a register are displayed. All elements are subordinate to the Top. That is, the sub-block information, node information, etc. are all deleted. The deleting method is explained by referring to FIGS. 10 and 11.

Figure 10:
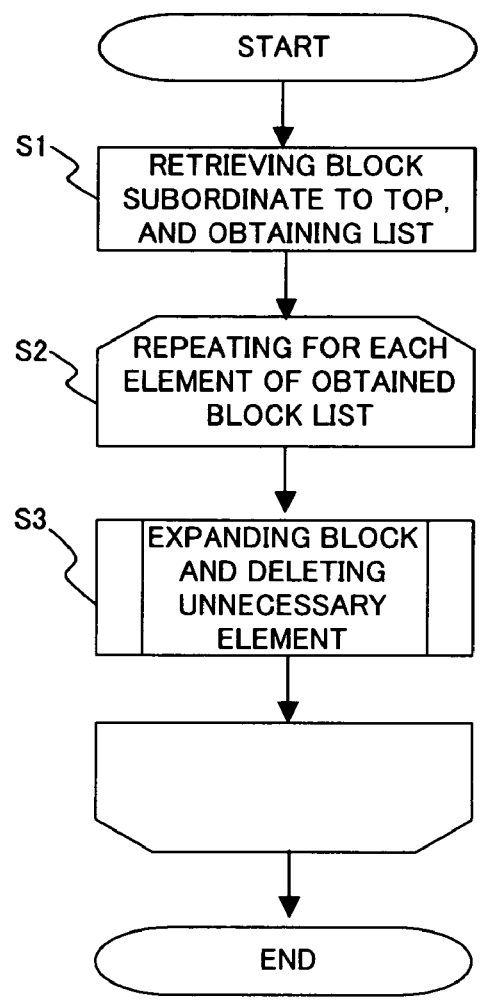
FIG. 10 is a flowchart (part 1) in which node information other than the register to which a clock/data signal is connected is deleted when an asynchronous path retrieval is performed in the embodiment 1 according to the first embodiment.
Figure 11:
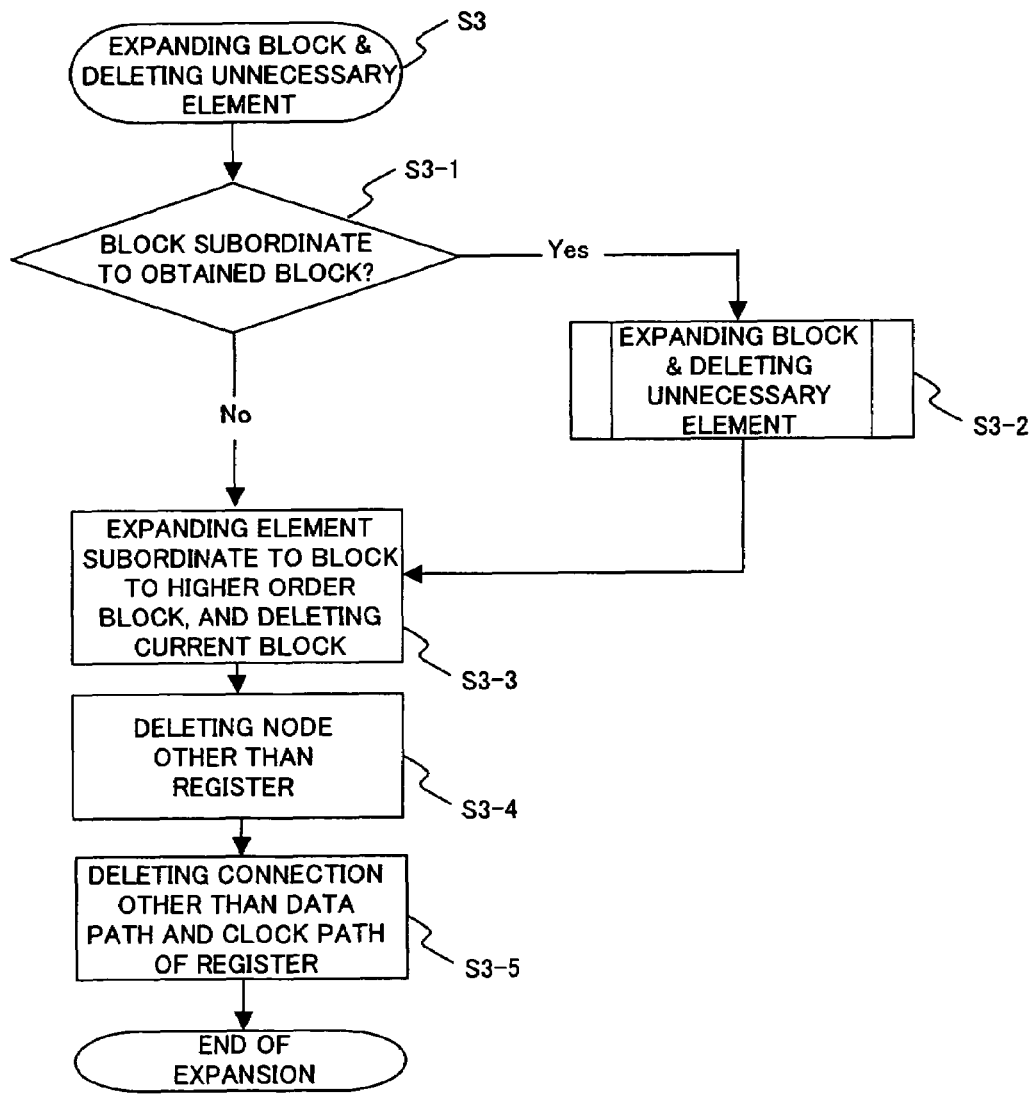
FIG. 11 is a flowchart (part 2) in which node information other than the register to which a clock/data signal is connected is deleted when an asynchronous path retrieval is performed in the embodiment 1 according to the first embodiment.

FIGS. 10 and 11 are flowcharts in which node information other than the register to which a clock/data signal is connected is deleted when an asynchronous path retrieval is performed in the embodiment 1 according to the present embodiment. For example, a user designs a circuit as shown in FIGS. 6 and 7 using the HDL. After the designing process, the user inputs HDL design data to the HDL data structure analysis system 100. The control device in the HDL data structure analysis system 100 reads the input HDL design data, and performs the flow shown in FIGS. 10 and 11.

First, the block subordinate to the Top is retrieved, and a list of the retrieved blocks is obtained (step 1) (hereinafter "step" is referred to as "S"). In the present embodiment, a list of blocks including the Sub 1 and Sub 2 subordinate to the Top is obtained.

Next, for each element (Sub 1, Sub 2) of the obtained block list, a block expanding and unnecessary element deleting process (S3) is repeated (S2). The details of the block expanding and unnecessary element deleting process in S3 are shown in FIG. 11.

First, the case of the Sub 1 is explained below. In the block extracting and unnecessary element deleting process in S3, it is first determined whether or not there is a block subordinate to the block currently being selected in the obtained block list (S3-1).

The currently selected block is the Sub 1. In FIGS. 6 and 7, since there is no block subordinate to the Sub 1 (control is passed to "NO" in step S3-1), the element subordinate to the block is expanded to a higher order block, and the current block is deleted. In this case, the element subordinate to the block Sub 1 is expanded to the Top which is a higher order block, and the block Sub 1 is deleted (S3-3).

That is, the information managed by the Sub 1 (11), that is, the information about the register 1 (11d), register 2 (11e), the input ports of the In 1 (11a), In 2 (11b), and In 3 (11c), an the output ports of the Out 1 (11f) and Out 2 (11g), is defined as the information under the management of the Top, and the Sub 1 (11) is deleted.

In the nodes expanded to higher order blocks in S3-3, those other than registers are deleted (S3-4). In this case, the input ports of the In 1 (11a), In 2 (11b), and In 3 (11c) and the Out 1 (11f) and the Out 2 (11g) other than the register 1 (11d) and the register 2 (11e) are deleted.

Then, the connections other than the data path and the clock path of the register are deleted (S3-5). In this case, there are no connections to be deleted.

Thus, the process in S3 is over for the Sub 1, and the process in S3 is performed on the next block Sub 2 in the block list (S2). The Sub 2 is explained below. It is determined whether or not there is a block subordinate to the current block (S3-1).

In FIG. 6, since there is the block Sub 3 subordinate to the Sub 2 (control is passed to step YES in S3-1), the block of Sub 3 is expanded (S3-2). That is, the process in S3 is performed on the block Sub 3.

Since there is no block subordinate to the Sub 3 (control is passed to NO in S3-1), the elements subordinate to the Sub 3 are expanded to the higher order block Sub 2, and the current block Sub 3 is deleted (S3-3).

That is, the information managed by the Sub 3 (13), that is, the information including the register 1 (13c), the input ports of the In 1 (13a) and In 2 (13b), and the output port of the Out 1 (13d), is defined as the information under management of the Sub 2, and the Sub 3 (13) is deleted.

In the elements expanded to the block Sub 2 in S3-3, those other than the registers are deleted (S3-4). In this case, the input ports of the In 1 (13a) and In 2 (13b) and the output port of the Out 1 (13d) other than the register 1 (13c) are deleted.

Then, the connections other than the data path and the clock path of the register are deleted (S3-5). In this case, there are no connections to be deleted.

Thus, the process in S3 is over on the Sub3 (S3-2), and the process in S3-3 is performed on the block Sub 2. That is, the information managed by the Sub 2, that is, the information about the register 1 (12e), the Not circuit (12f), the AND circuit (12i), the input ports of the In 1 (12a), In 2 (12b), In 3 (12c), and In 4 (12d), and the output ports of the Out 1 (12g) and Out 2 (12h), and the register 1 (13c) is defined as the information under management of the Top, and the Sub 2 (12) is deleted.

Next, in the element expanded to the Top in S3-3, those other than the registers are deleted (S3-4). In this case, the Not circuit (12f), the AND circuit (12i), the input ports In 1 (12a), In 2 (12b), In 3 (12c), and In 4 (12d), and the output ports of the Out 1 (12g) and Out 2 (12h) other than the register 1 (12e) and the register 1 (13c) are deleted.

Then, the connections other than the data path and the clock path of the register are deleted (S3-5). In this case, the connection between the Q terminal of the register 1 (11e) and the CLR terminal of the register 1 (12e), the connection between the output terminal of the Not circuit (12f) and the input terminal of the AND circuit (12i), the connection between the Q (inverse) terminal of the register 1 (12e) and the input terminal of the AND circuit (12i), and the connection between the output terminal of the AND circuit (12i) and the output port of the Out 2 (10g) is deleted.

As a result, as shown in FIGS. 8 and 9, the DB from which the node information other than the registers to which the clock/data signals are connected is deleted can be obtained. The circuit configuration shown in FIGS. 6 and 7 is an example, and the present invention is not limited to the example, but can be applied to other circuit configurations.

Thus, the registers can be accessed without blocks, and the time required for the analyzing process can be shortened.

(Embodiment 2) in case where inter-block signal information extraction is performed The inter-block signal information extraction according to the present embodiment is explained below. As described above, since a DB is structured depending on the type of analysis, a DB for the inter-block signal information extraction according to the present embodiment is structured.

In the inter-block signal information extraction, only the connection status between blocks is required. Therefore, other elements can be deleted. Then, the DB is changed as follows.

Figure 12:
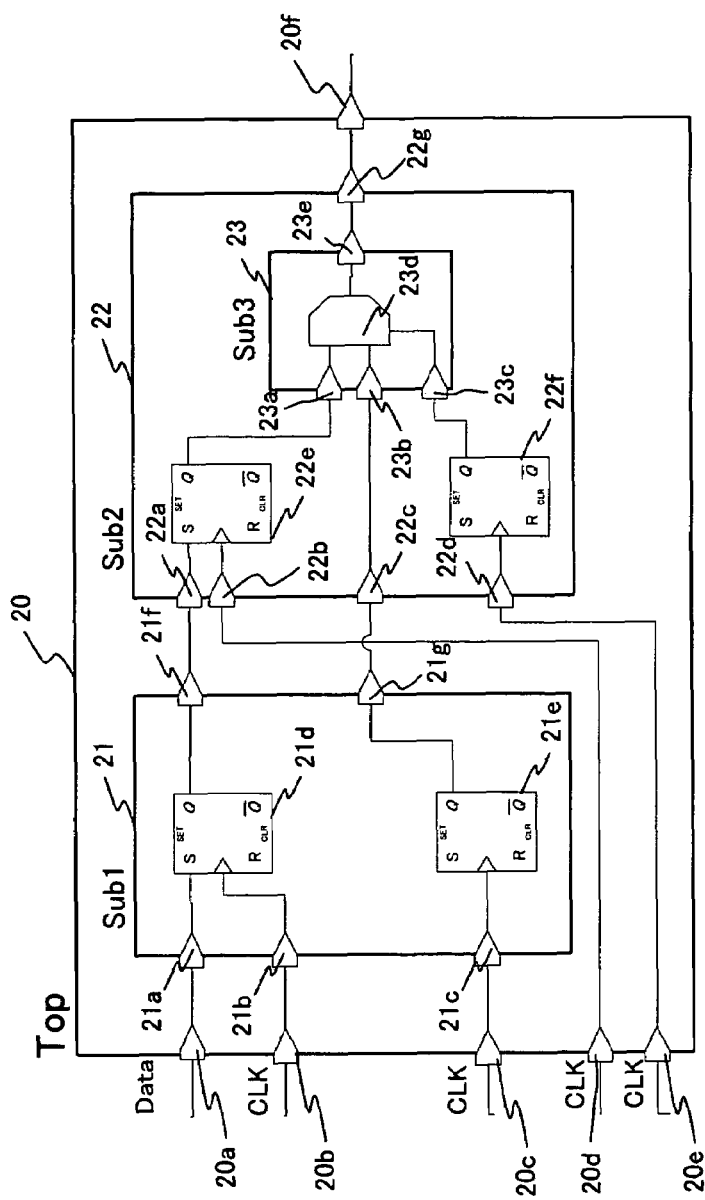
FIG. 12 shows a circuit configuration including all information in the replicated master DB in the embodiment 2 according to the first embodiment.
Figure 13:
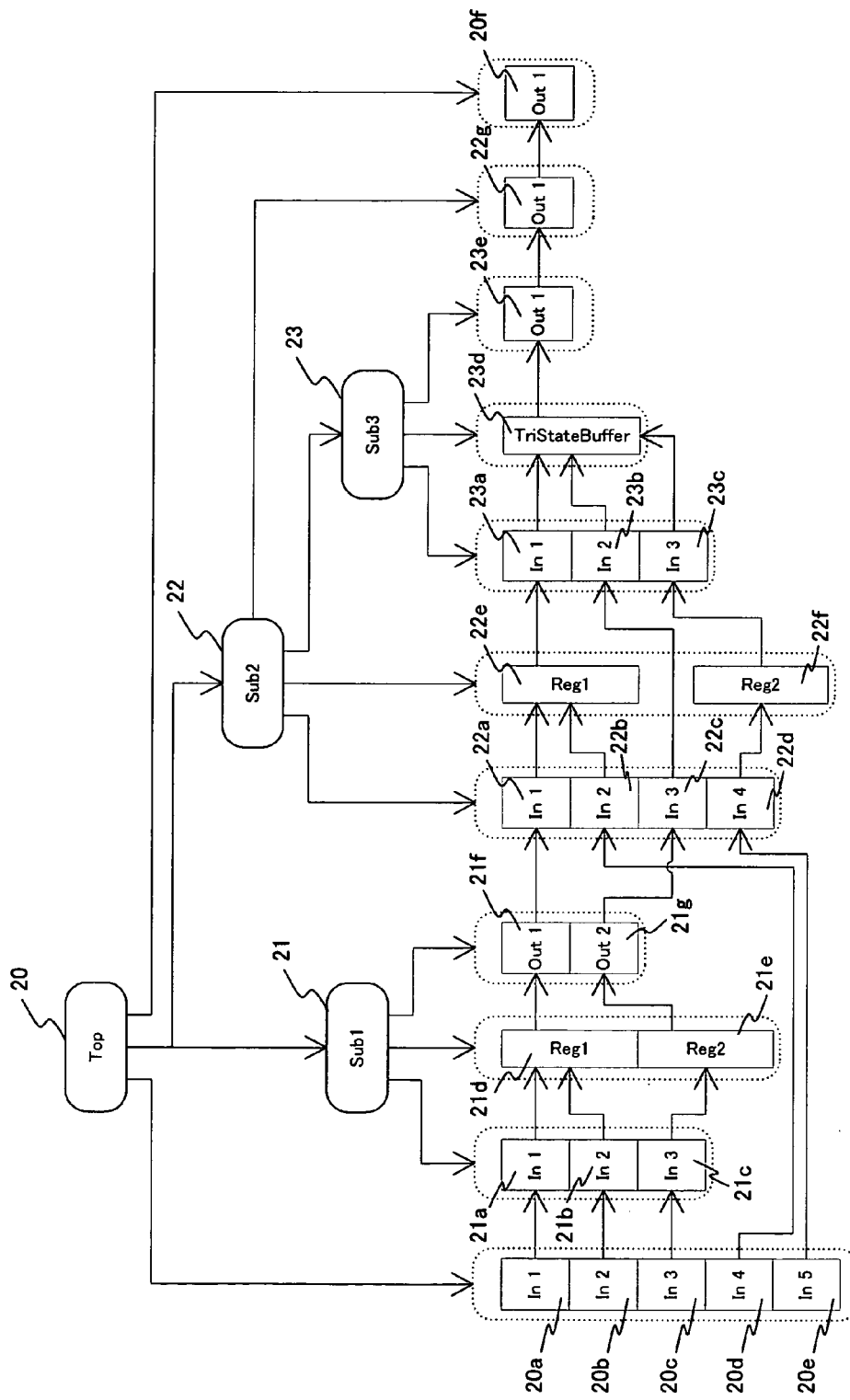
FIG. 13 shows a concept of the circuit configuration shown in FIG. 12.

FIG. 12 shows an example of a circuit configuration including all information in the replicated master DB in the embodiment 2 according to the present embodiment. FIG. 13 shows the concept of the circuit configuration shown in FIG. 12. In the present embodiment, the concept of the circuit configuration in the highest order is represented by Top (20), and its subordinates are a block represented by Sub 1 (21) and a block represented by Sub 2 (22). A subordinate to the Sub 2 (12) is a block Sub 3 (13). As in the embodiment 1, each block information manages a block subordinate to the current block and the information about a node group. The node information about an input/output port, a register, etc. managed by a block are also shown in FIG. 13. The connection information between nodes is held by a node itself.

The information managed by the Top (20) is the information including the blocks of the Sub 1 (21) and Sub 2 (22) subordinate to the Top, and the information about the input ports of In 1 (20a), In 2 (20b), In 3 (20c), In 4 (20d) and In 5 (20e), and the output ports of Out 1 (20f).

The information managed by the Sub 1 (21) is the information including a register 1 (21d) and a register 2 (21e) and the information about the input ports of the In 1 (21a), In 2 (21b), and In 3 (21c) and the output ports of the Out 1 (21f) and Out 2 (21g).

The information managed by the Sub 2 is the information including the Sub 3 (23) subordinate to the Sub 2, and the information about the register 1 (22e) and register 2 (22f), and the input ports of In 1 (22a), In 2 (22b), In 3 (22c), and In 4 (22d), and the output ports of the Out 1 (22g).

The information managed by the Sub 3 (13) is the information including the tri-state buffer (23d) and the information about the input ports of the In 1 (23a), In 2 (23b), and In 3 (23c), and the output ports of the Out 1 (23e).

Since only the connection status between blocks is to be obtained in the inter-block signal information extraction, other elements can be deleted. Therefore, the DB is changed as shown in FIGS. 14 and 15.

Figure 14:
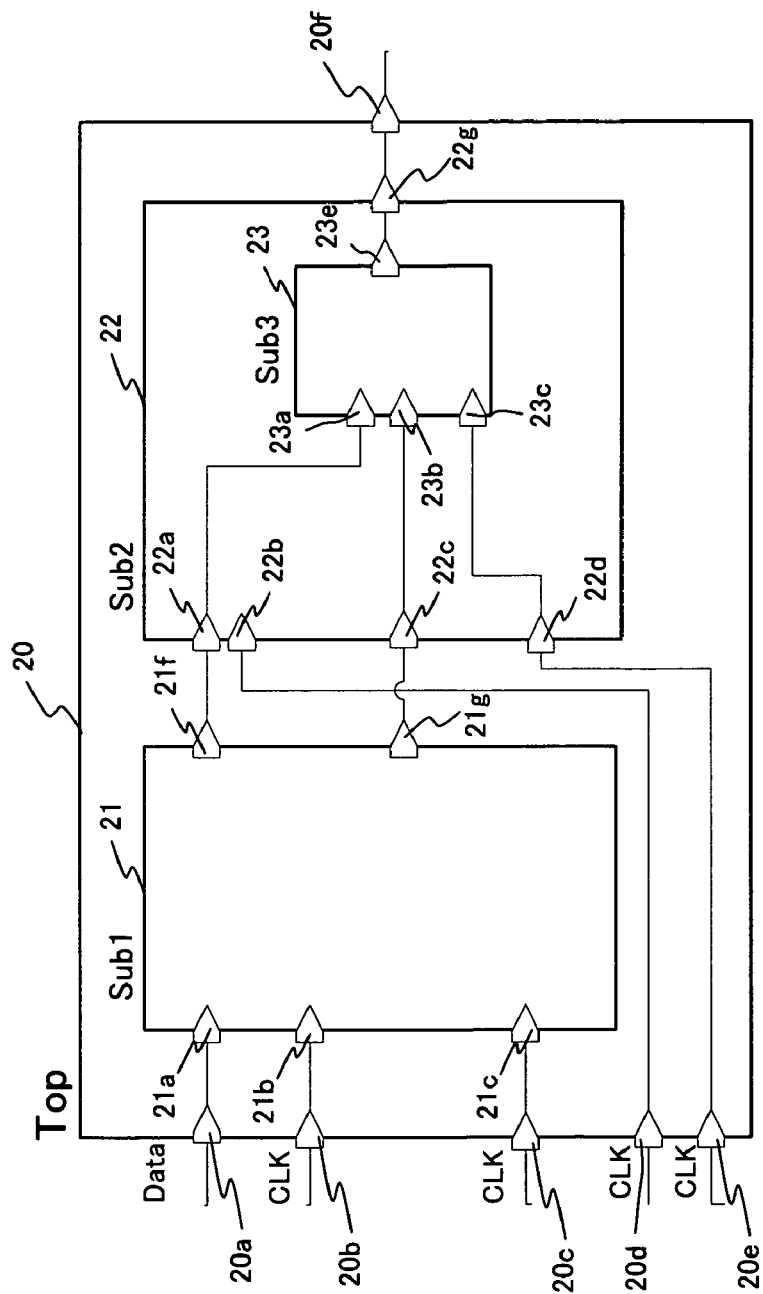
FIG. 14 shows the circuit configuration in which elements other than the information about connections between clocks are deleted when signal information between blocks is extracted in the embodiment 2 according to the first embodiment.

FIG. 14 shows the circuit configuration in which elements other than the information about connections between clocks are deleted when signal information between blocks is extracted in the embodiment 2 according to the present embodiment. FIG. 15 shows the concept of the circuit configuration shown in FIG. 14.

Figure 15:
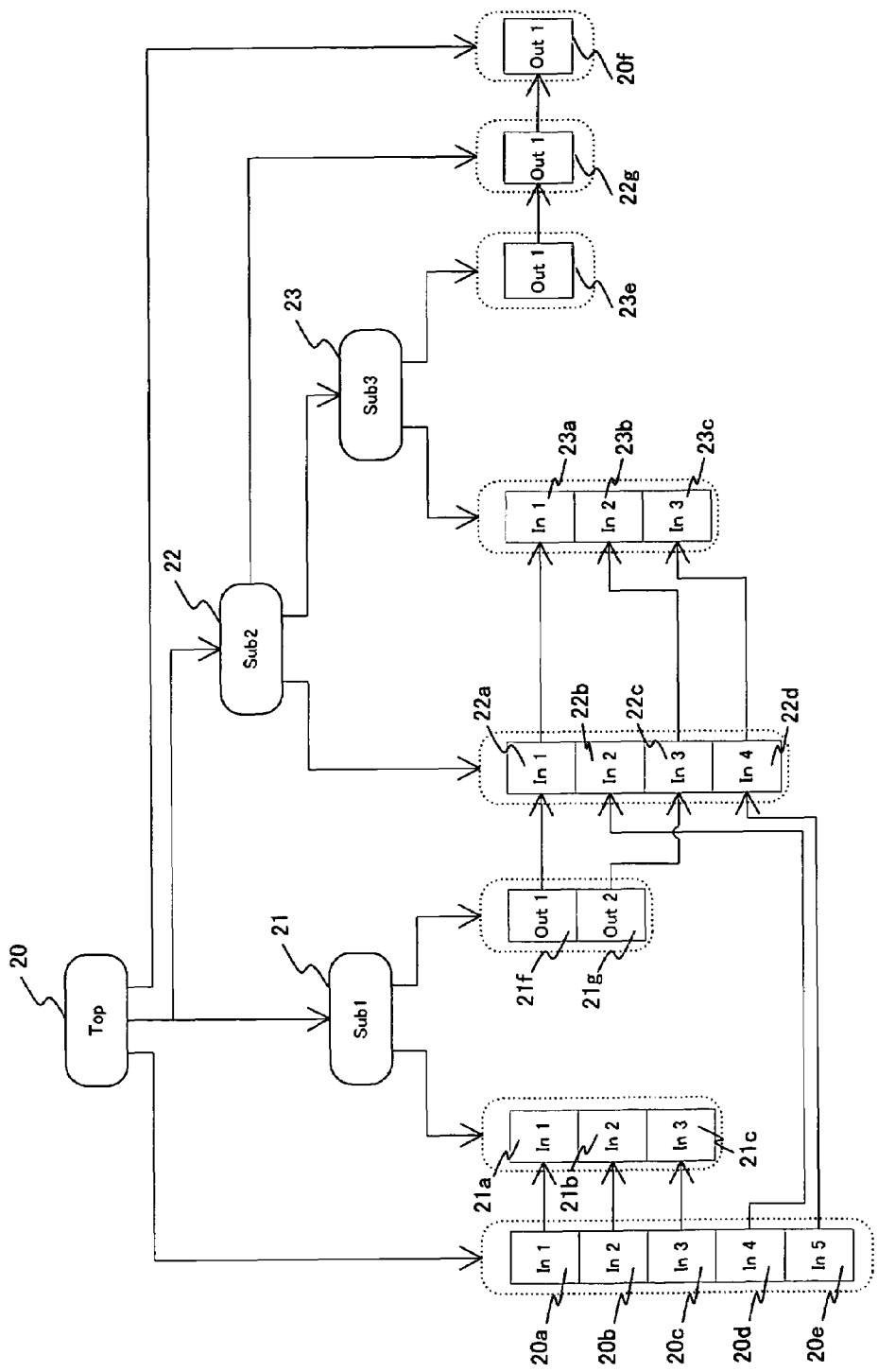
FIG. 15 shows the concept of the circuit configuration shown in FIG. 14.

In FIGS. 14 and 15, the blocks Sub 1 (21), Sub 2 (22), and Sub 3 (23), the input/output ports In 1 (21a), In 2 (21b), In 3 (21c), Out 1 (21f), Out 2 (21g), In 1 (22a), In 2 (22b), In 3 (22c), In 4 (22d), Out 1 (22g), In 1 (23a), In 2 (23b), In 3 (23c), and Out 1 (23d) of each block, the input/output ports In 1 (20a), In 2 (20b), In 3 (20c), In 4 (20d), In 5 (20e), Out 1 (20f) of the Top, and the connection between blocks are shown. The information in the other sub-blocks, register information, etc. is all deleted.

Figure 16:
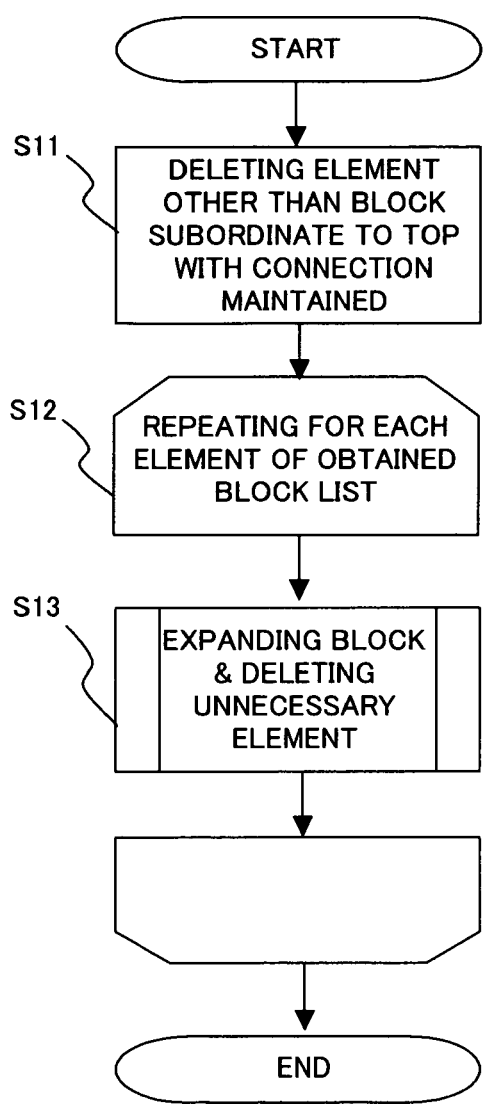
FIG. 16 is a flowchart (part 1) in which elements other than the information about connections between clocks are deleted when inter-block signal information extraction is performed in the embodiment 2 according to the first embodiment.
Figure 17:
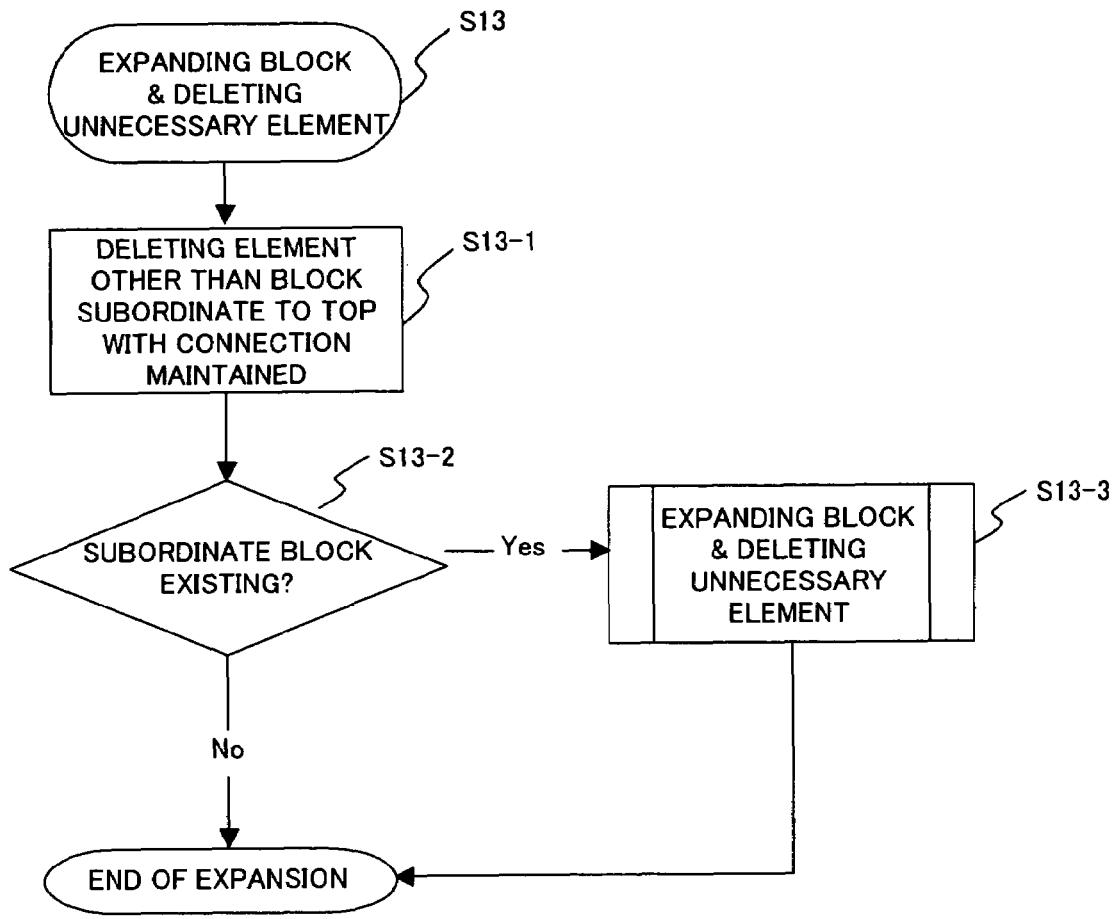
FIG. 17 is a flowchart (part 2) in which elements other than the information about connections between clocks are deleted when inter-block signal information extraction is performed in the embodiment 2 according to the first embodiment.

FIGS. 16 and 17 show flowcharts in which elements other than the information about connections between clocks are deleted when inter-block signal information extraction is performed in the embodiment 2 according to the present embodiment. For example, a user designs a circuit as shown in FIGS. 12 and 13 using the HDL. After the designing process, the user inputs the HDL design data in the HDL data structure analysis system 100. The control device in the HDL data structure analysis system 100 reads the input HDL design data, and performs the flows shown in FIGS. 16 and 17.

First, the elements other than the blocks subordinate to the Top are deleted with the connections maintained (S11). In the present embodiment, since there is only blocks and the connections between blocks subordinate to the Top (20), there is nothing to be deleted. At this time, a block subordinate to the Top (20) is retrieved, and a list of retrieved blocks is obtained. In the present embodiment, a list of blocks comprising the Sub 1 (21) and Sub 2 (22) subordinate to the Top (20) is obtained.

Then, the block expanding and unnecessary element deleting process (S13) is repeated for each element (Sub 1, Sub 2) in the list of the obtained blocks (S12). FIG. 17 shows the details of the block expanding and unnecessary element deleting process in S13.

First, the Sub 1 (21) is explained below. In S13, the elements other than the blocks subordinate to the obtained block are deleted with the connections maintained (S13-1). In FIGS. 12 and 13, in the block Sub 1 (21), the register 1 (21*d*) and register (21*e*) that are the elements other than the block Sub 1 (21) are deleted. Since the present embodiment aims at confirming the connection line status between blocks, input/output ports are not deleted in principle. Therefore, the input ports In 1 (21*a*), In 2 (21*b*), and In 3 (21*c*) and the output ports Out 1 (21*f*), and Out 2 (21*g*) are left as is.

Next, it is determined whether or not there is a further block subordinate to the current block (S13-2). In this case, since there in no block (control is passed to NO in S13-2) subordinate to the Sub 1 (21), the process in S13 terminates.

Then, the process in S13 terminates on the Sub 1, and the process in S13 is performed on the next block Sub 2 in the block list (S12). In this example, the Sub 2 is explained. First, the elements other than the block subordinate to the obtained block are deleted with the connections maintained (S13-1).

In FIGS. 12 and 13, among those subordinate to the block Sub 2 (22), the elements other than the block Sub 2 (22), that is, the register 1 (22*e*) and register 2 (22*f*), are deleted. Although the register 1 (22*e*) is deleted, the S input terminal and the Q output terminal of the register 1 (22*e*) are connected to each other to maintain a connection between blocks. Similarly with the register 2 (22*f*), the input terminal and the Q output terminal of the clock signal are connected by deleting the register 2 (22*f*). Thus, which input terminal can be connected to which output terminal is the information provided as an attribute assigned in advance in the HDL when a register is generated.

Since the present embodiment aims at confirming the line connection status between blocks, the input/output ports are not deleted in principle.

Next, it is determined whether or not there is a further block subordinate to the current block (S13-2). In this case, since there is the block Sub 3 (23) subordinate to the Sub 2 (22) (control is passed to YES in S13-2), the block expanding and unnecessary element deleting process is performed (S13-3). That is, the process in S13 is performed on the block Sub 3.

First, in those subordinate to the block Sub 3 (23), the tri-state buffer (23*d*), that is, the element other than the block Sub 3 (23), is deleted. Since the present embodiment aims at confirming the connection line status between blocks, input/output ports are not deleted in principle. Therefore, the input ports In 1 (23*a*), In 2 (23*b*), and In 3 (23*c*) and the output port Out 1 (23*e*) are left as is.

Since the process (S13-3) in S3 on the Sub 3 is completed, the entire process in S3 subordinate to the Sub 2 is completed. No more blocks are found in the present embodiment, the flow terminates.

The circuit configurations shown in FIGS. 12 and 13 are only examples, and the present invention is not limited to these examples, and the present embodiment can be applied to other circuit configurations.

With the above-mentioned configuration, only the blocks and the input/output ports which are interfaces between the blocks are left as connection information between blocks. As a result, Information about connections between block are left. Then a block is designed to be adjacent to the next block, thereby simplifying the circuit configuration. Thus, the elements other than blocks are deleted, and the intrablock element retrieving process can be performed at a high speed.

According to the present embodiment, a designed product can be efficiently analyzed on the circuit design using the HDL. When a structure analyzing database (DB) is structured, unnecessary information for analysis is deleted, thereby performing optimization, and the memory consumption can be reduced, and the analyzing process can be improved.

Second Embodiment

In the present embodiment, elements are changed by way of trial in the analyzing process, and the analysis is continuously performed as described below.

Since it takes some hours to structure an analyzing DB in a large circuit, the performance can be enhanced if the time can be effectively used. Therefore, assume that a plurality of blocks forming a large circuit are generated, the generation of some blocks is slow, and the blocks have not been internally generated.

In this case, a master DB is structured in advance using generated blocks and dummy modules for the blocks not yet designed, and the analyzing process is continued. Afterwards, when the late blocks are completed, they replace the dummy modules and are added to the master DB. Thus, the analyzing process is performed again on the complete master DB.

Thus, since the connection line status of the generated blocks can be checked at the early stage, the circuit can be efficiently designed.

Figure 18:
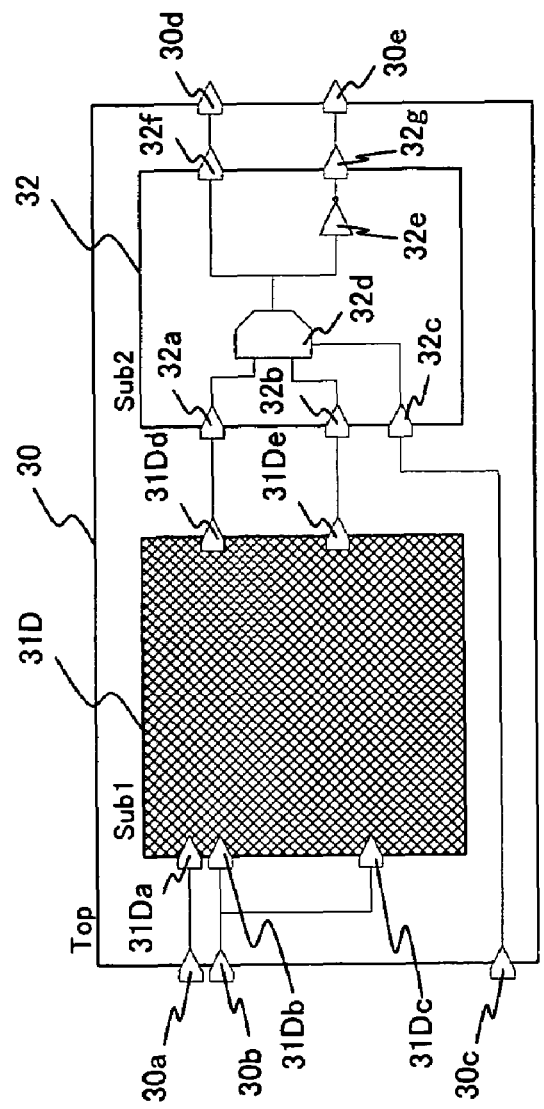
FIG. 18 shows an example of a circuit configuration into which a dummy module according to the second embodiment is incorporated.
Figure 19:
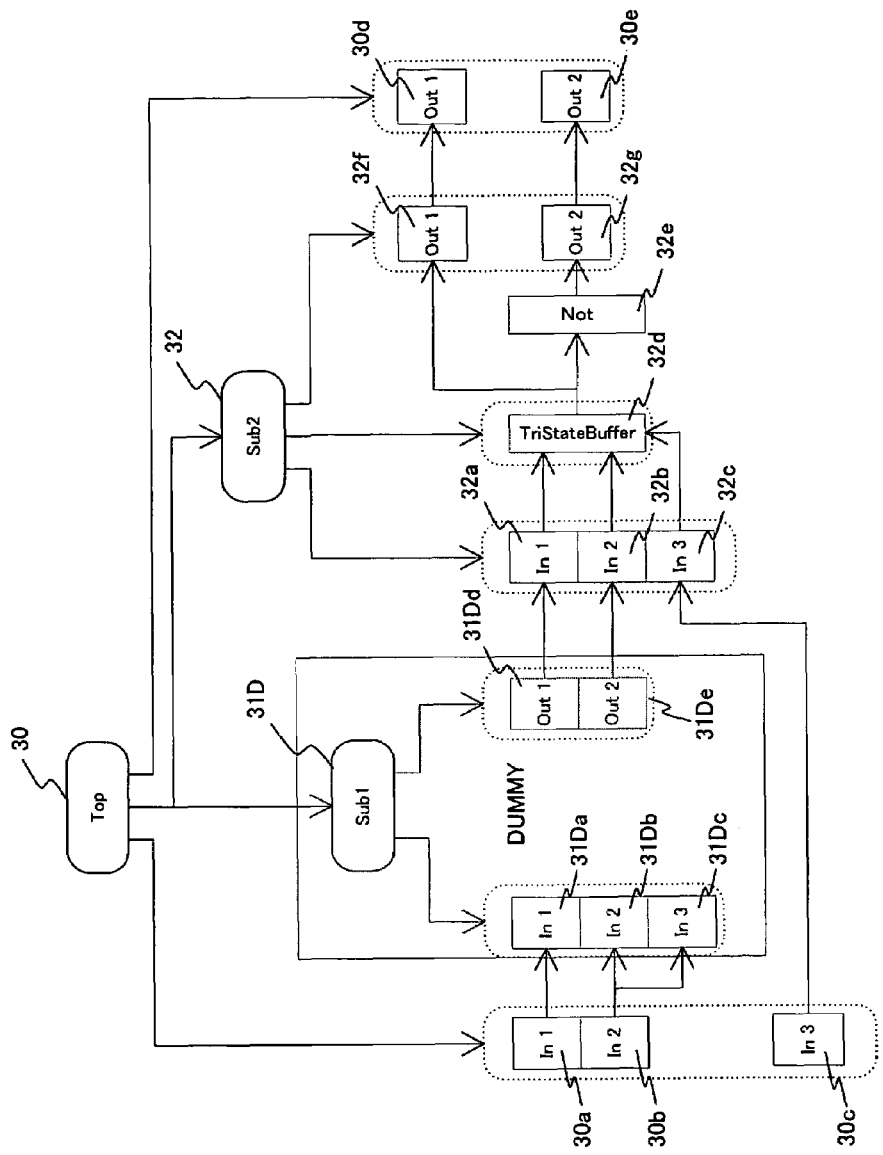
FIG. 19 shows the concept of the circuit configuration shown in FIG. 18.

FIG. 18 shows an example of a circuit configuration into which a dummy module according to the present embodiment is incorporated. FIG. 19 shows the concept of the circuit configuration shown in FIG. 18.

In the present embodiment, the highest order concept of the circuit configuration is represented by a Top (30), which is followed by a dummy module Sub 1 (31D) and a normal module Sub 2 (32). As in the first embodiment of the present invention, the Sub 2 (32) manages the information about the subordinate blocks and node group, and also indicates the node information about the input/output ports, registers, etc. managed by the blocks. The connection information between nodes is held by the nodes.

The information managed by the Top (30) is the information including the blocks of a subordinate dummy module Sub 1 (31D) and a normal module Sub 2 (32), and the information about the input ports of In 1 (30*a*), In 2 (30*b*), In 3 (30*c*) and the output ports of Out 1 (30*d*), and Out 2 (30*e*).

The information managed by the dummy module Sub 1 (31D) is the information about the input ports of In 1 (31Da), In 2 (31Db), and In 3 (31Dc), and the output ports of Out 1 (31Dd) and Out 2 (31De). A dummy module is formed by a block which has not been internally designed yet and an input/output ports, that is, a module only having input/output ports as members of a class. An input/output port is minimal information required when a conversion to a module is performed in HDL design, and is information designed for connection to external.

The information managed by the Sub 2 is the information about a tri-state buffer (32*d*), a Not circuit (32*e*), the input ports of In 1 (32*a*), In 2 (32*b*), and In 3 (32*c*), and the output port of Out 1 (32*f*), and Out 2 (32*g*).

Since there is a portion not implemented yet in the large circuit designed by a user, a circuit including the dummy module 31D is designed for the portion not implemented yet as shown in FIG. 18, and the analyzing DB structuring process can be started as described later.

At this time, since structuring an analyzing DB of a large circuit takes some time, the normal module 31 (FIGS. 21 and 22) is generated using the waiting time, and replaces the dummy module 31D, thereby performing the analyzing process.

Figure 21:
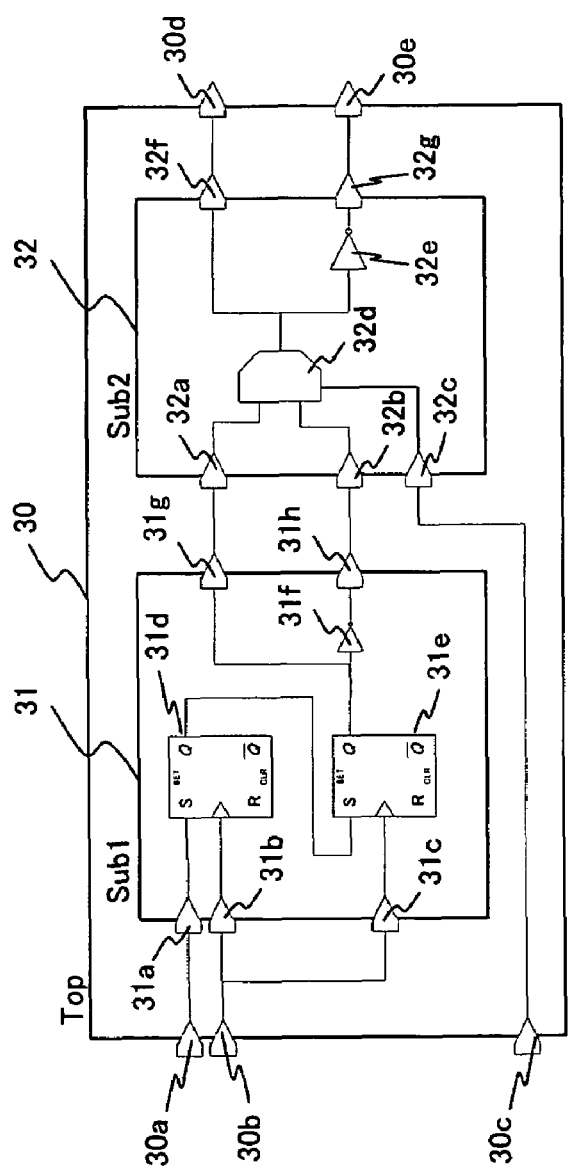
FIG. 21 shows an example of a circuit configuration into which a normal module is incorporated according to the second embodiment.
Figure 22:
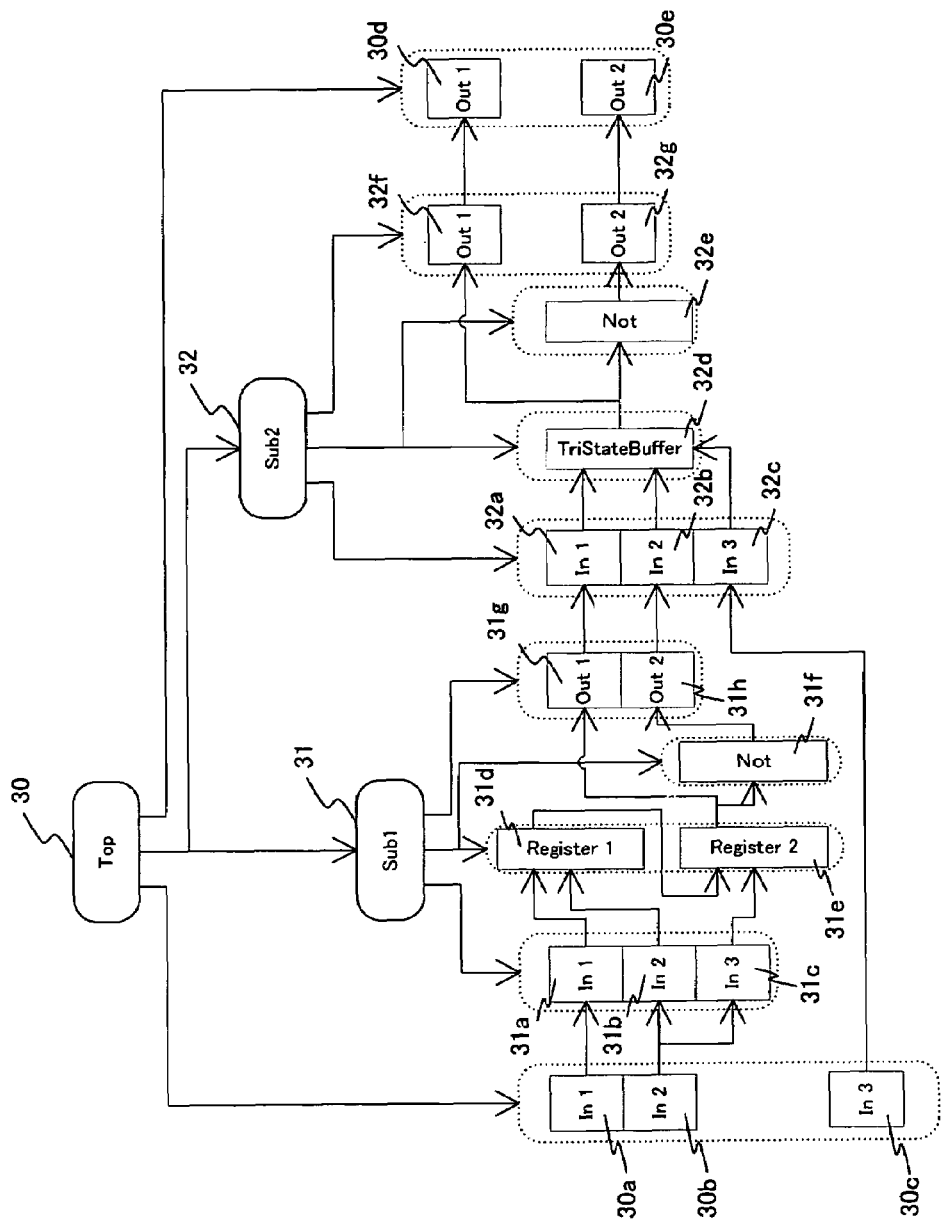
FIG. 22 shows the concept of the circuit configuration shown in FIG. 21.

FIG. 20 shows replacement of the dummy module 31D with a normal module 31 according to the present embodiment. FIG. 21 shows an example of a circuit configuration into which a normal module is incorporated according to the present embodiment. FIG. 22 shows the concept of the circuit configuration shown in FIG. 21. In FIGS. 21 and 22, the dummy module Dub 1 (31D) is replaced with the normal module Sub 1 (31).

The information managed by the Sub 1 (31D) is the information about register 1 (31*d*) and register 2 (31*e*), Not circuit (31*f*), the input ports of In 1 (31*a*), In 2 (31*b*), and In 3 (31*c*), and the output ports Out 1 (31*g*) and Out 2 (31*h*).

Figure 23:
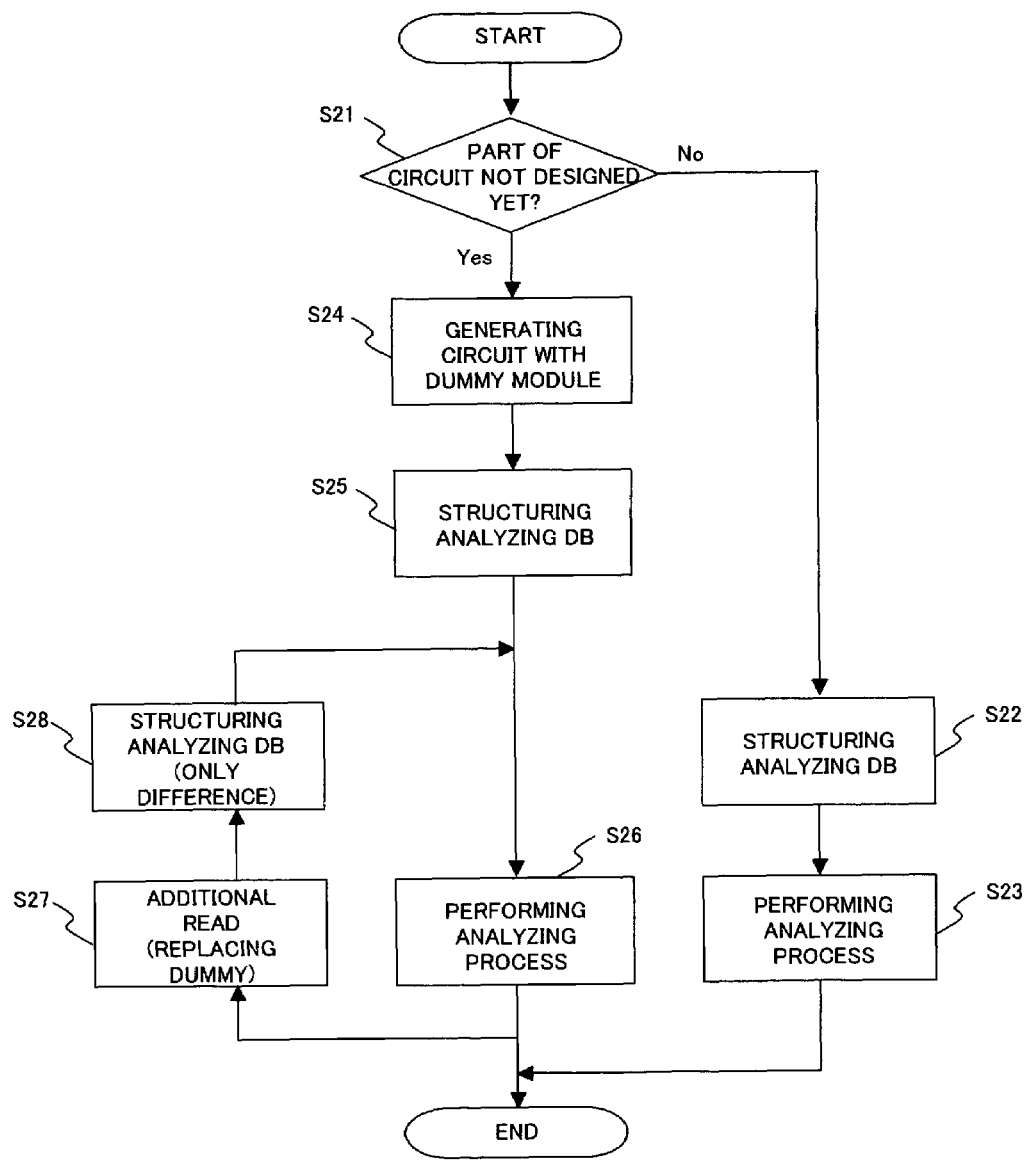
FIG. 23 is a flowchart of replacing a module according to the second embodiment.

FIG. 23 is a flowchart of replacing a module according to the present embodiment. For example, a user designs a predetermined circuit using the HDL. After the designing process, the user inputs the HDL design data to the HDL data structure analysis system 100. The control device in the HDL data structure analysis system 100 reads the HDL design data, and performs the following flow.

The control device confirms whether or not a part of the input HDL design data is incomplete (S21). If the circuit does not include any incomplete portion (control is passed to NO in S21), the control device structures an analyzing DB based on the HDL design of the circuit to be analyzed (S22). Then, the control device performs the analyzing process on the analyzing DB (S23).

When a part of the circuit is not completely designed (control is passed to "YES" in S21), the control device generates a dummy module according to the block information only having input/output ports. Then, using the dummy module for the portion not designed yet, the control device generates a circuit including a dummy module (S24).

Then, the control device structures an analyzing DB based on the data of the circuit including the dummy module (S25). As described above, it takes some time to structure an analyzing DB. Therefore, the user designs a normal module using the waiting time.

Next, the analyzing process is performed on the analyzing DB structured in S25 (S26). As described above, the analyzing process mainly confirms the connection line status between blocks.

If the block (normal module) not completely designed yetis completed after performing the analyzing process, the additional HDL design data is input to the HDL data structure analysis system 100. The control device reads the input additional HDL design data, and converts it to a module (normal module). The control device then replaces the dummy module with the normal module (S27) (refer to FIG. 20).

Then, the control device structures an analyzing DB (S28). In this example, a difference module (replacing module in S27) is added to the DB structured in S25. Thus, it is not necessary to structure an analyzing DB from the beginning again.

On the analyzing DB to which the difference module is added in S28, the control device performs a analyzing process (S26). When there is a portion not designed yet (that is, a dummy module exists in the analyzing DB), the processes S27→S28→S26 are repeated.

Thus, although there is a block (module) not designed yet, a dummy module can be used and the connection status between blocks can be confirmed. Since a connection status relating to a generated block can be confirmed at an early stage, the circuit can be efficiently designed.

Also by combining the first embodiment with the present embodiment, the present embodiment can be furthermore effectively utilized. For example, when a plurality of blocks forming a large circuit are generated in advance, the status of line connections between blocks is confirmed according to the second embodiment. Then, each block is implemented internally in detail, and the implemented portion is processed according to the first embodiment, thereby efficiently designing a circuit.

According to the present embodiment, although a block (module) which has not been completely designed is detected, it can be replaced with a dummy module to confirm the status of line connections between blocks.

Third Embodiment

In the present embodiment, a logical composition rule is added, and a conversion to a user-defined module is performed as explained below. Logical composition refers to automatic generation of a logical circuit at a gate level from the design data described in the hardware description language such as HDL, etc. A logical composition rule defines a rule for performing such logical composition.

Figure 24:
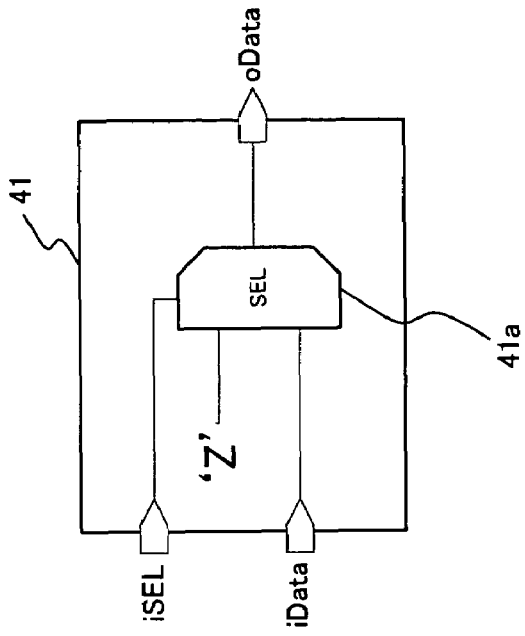
FIG. 24 is an explanatory view of generating a selector from the HDL description according to the third embodiment.

FIG. 24 is an explanatory view of generating a selector from the HDL description according to the present embodiment. In FIG. 24, for example, a selector satisfying a predetermined condition is recognized as a tri-state buffer.

However, in an HDL description example 40 shown in FIG. 24, if there is no logical composition rule for a normal tri-state buffer because of, for example, an if statement, then it is recognized as a selector as shown by 41. However, by adding a composition rule of the tri-state buffer, a tri-state buffer can be composed. A composition rule of the tri-state buffer is shown in FIG.25

Figure 25:
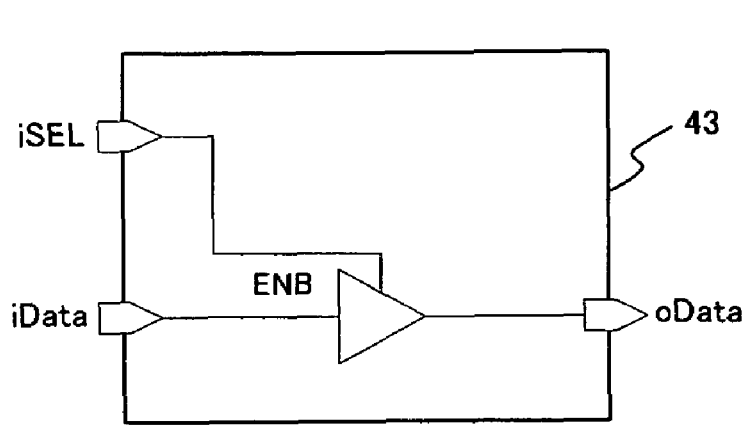
FIG. 25 shows an example of conversion to a tri-state buffer under a predetermined condition according to the third embodiment.

FIG. 25 shows an example of conversion to a tri-state buffer under a predetermined condition according to the present embodiment. As an example (42) of a composition condition can be "(1) There are three input data signals; (2)

One of the input data is a constant value 'Z'; (3) Using the value 'Z' refers to 'no conditional expression'; (4) There is one output data signal."

The above-mentioned conversion can be realized by a user script generation (in this example, a TCL (tool command language) is used). A script example for conversion of the selector such as one in the HDL description example 40 shown in FIG. 24 to a tri-state buffer is shown in FIG. 26.

FIG. 26 shows a description example (44) of a composition rule according to the present embodiment. The description contents of the description example (44) is explained below. First, a command "search_litelal-value Z" retrieves the value 'Z' from the analyzing DB (corresponding to the composition condition (2) above). A "for each Zliteral" statement repeats the process less than the times indicated by the value 'Z'.

A command "trace_forward node $ZLiteral" traces the node which is the first node before the detected value 'Z'. In the case shown in FIG. 24, the selector which is the first node before the value 'Z' is obtained.

Next, a command "get_input_node-node $node" obtains the number of input terminals of the node. In the case shown in FIG. 24, the number '3' of the input terminals of an obtained selector 41a is obtained.

Next, it is determined whether or not the number of input terminals of the obtained node is "3" (corresponding to the composition condition (1) above). When the number of input terminals of the node is other than "3", the process after "for each" statement is performed on the next value "Z". When the number of input terminals of the node is "3", a command "get_condition node $node $ZLiteral" obtains the information about the selector.

Then, it is determined whether or not the obtained selector is the value "Z" (corresponding to the composition condition (3) above). If the obtained selector is other than the value "Z", a command "get_output_node-node $node $ZLiteral" obtains the number of output terminals of the selector. In the case shown in FIG. 24, the number '1' of output terminals of the obtained selector 41a is obtained.

Next, it is determined whether or not the obtained number of output terminals is 1 (corresponding to the composition condition (4) above). When the number of output terminals is other than "1", the process after "for each" statement is performed on the next value "Z". If the number of output terminals is "1", the conditions (1) through (4) above are all satisfied, and the selector is converted to a tri-state buffer.

In the present embodiment, the TCL is used as a script language, but the present invention is not limited to this language, but any other script language can be used. In the present embodiment, a selector is converted to a tri-state buffer, but the present invention is not limited to this conversion. That is, an element matching the predetermined condition of the logical composition rule can be converted to an element defined in the logical composition rule.

Figure 27:
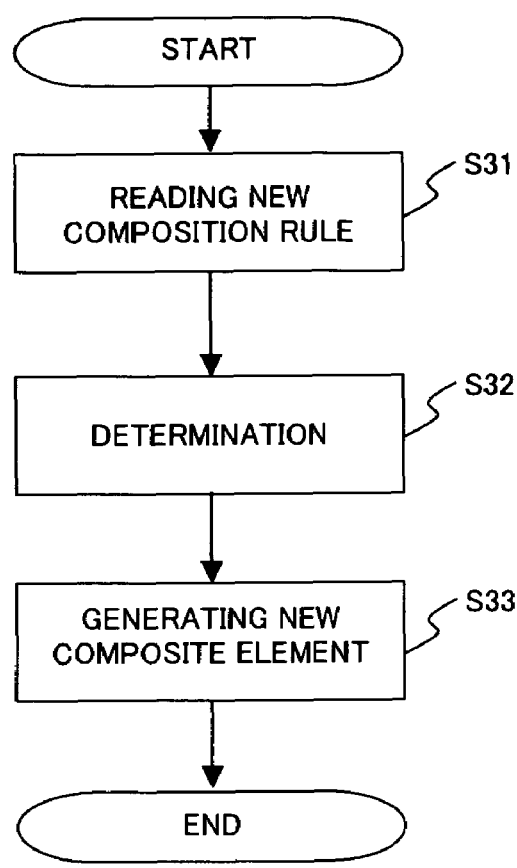
FIG. 27 is a flowchart of converting an added logical composition rule to a module according to the third embodiment.

FIG. 27 is a flowchart of converting an added logical composition rule according to the present embodiment to a module. First, a user generates a new logical composition rule. For example, a script as shown in FIG. 26 is generated by a user. Then, the generated logical composition rule is input to the HDL data structure analysis system 100. The input logical composition rule is read by the control device (S31) That is, for example, the control device reads the script.

Next, the control device determines, for example, an already structured analyzing DB based on the logical composition rule (S32). In the determining process, for example, as explained by referring to FIG. 26, the control device executes a command described in the logical composition rule, thereby determining whether or not there is a circuit configuration matching the logical composition rule in the analyzing DB.

When there is a circuit configuration matching the logical composition rule in S32, the control device generates a new composite element based on the logical composition rule (S33). For example, as described above, a tri-state buffer is generated, and a selector matching the logical composition rule is converted to the tri-state buffer, thereby connecting a line to a peripheral circuit, etc.

Figure 28:
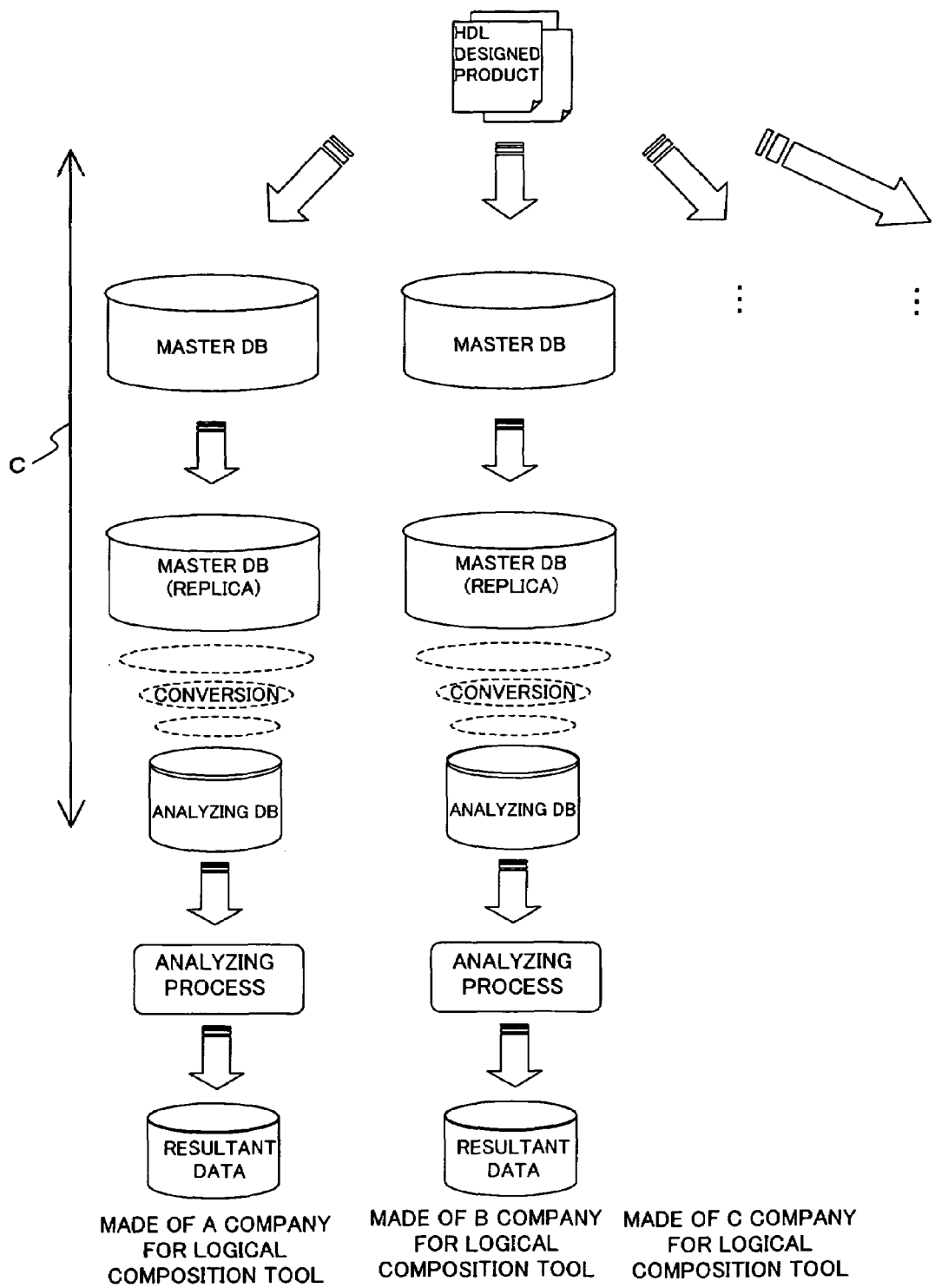
FIG. 28 shows reflecting the user-defined logical composition rule by the analyzing DB according to the third embodiment.

FIG. 28 shows the user-defined logical composition rule according to the present embodiment reflected by an analyzing DB. The logical composition tools are provided by a plurality of vendors, but the logical composition tools provided by each company is a different logical composition rule, and any one is general-purpose rule. Therefore, a newly added logical composition rule is to be generated corresponding to the logical composition tools used. However, as described above, since a user can easily generate a newly added logical composition rule according to the present embodiment using a script such as a TCL, etc., a logical composition rule satisfying the logical composition rule of each company.

Additionally, if the period (at the stage before the analyzing process) is indicated by the arrow C shown in FIG. 28, a user can add a logical composition rule. That is, a logical composition rule can be added to the HDL data input to the HDL data structure analysis system 100, and also can be added to the analyzing DB. The present embodiment can be combined with the first or second embodiment.

Thus, a logical composition rule is generated corresponding to a logical composition rule provided by each vendor, and a DB including the logical composition rule is structured, thereby performing a structure analysis. If the structure analysis has no problem, a logical composition rule provided by each vendor is used.

As described above, the logical composition rule of an analyzing DB can be added from the UI (User Interface). Thus, a specific patter on a database can be replaced with a user-defined element, and a more flexible analysis can be performed.

According to the present embodiment, a specific patter on a database can be replaced with a user-defined element, and a more flexible analysis can be performed.

Figure 29:
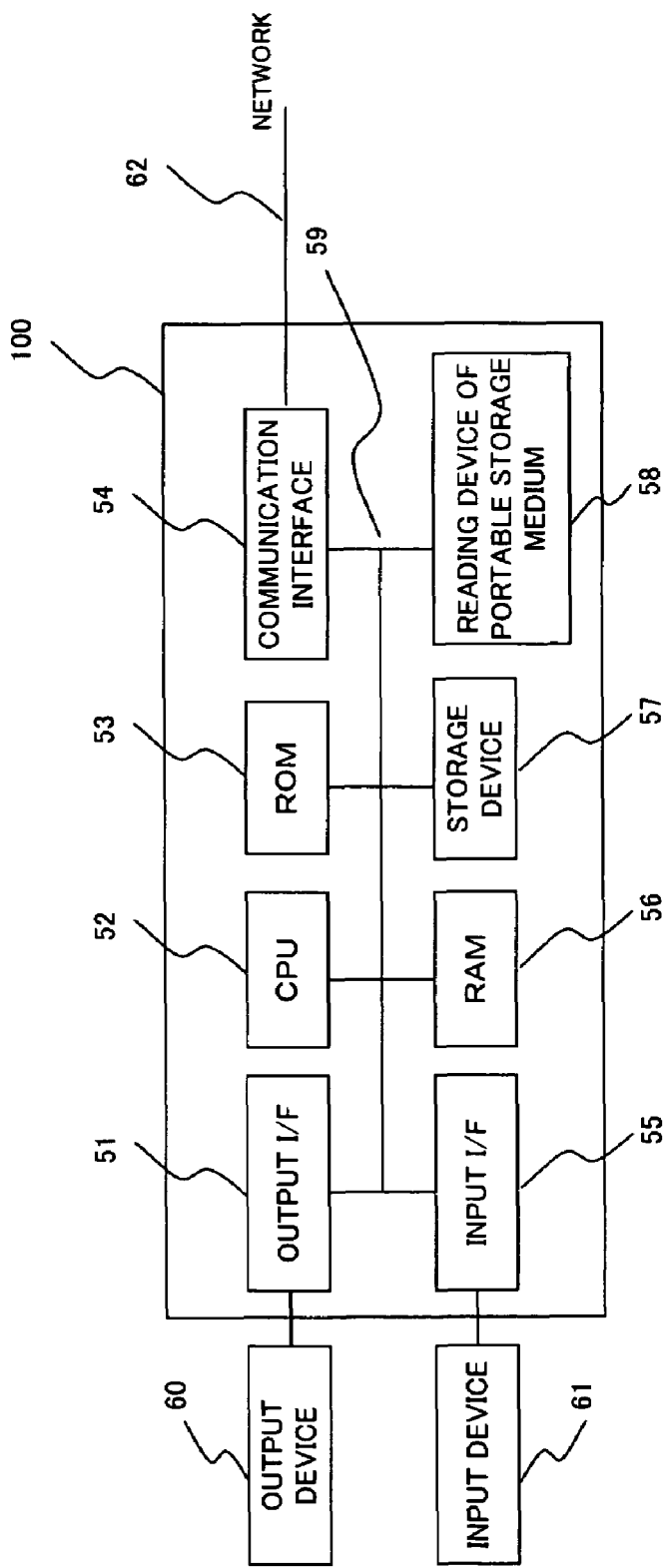
FIG. 29 is a block diagram of the configuration of the hardware environment of the HDL data structure analysis system 100 according to the first through third embodiments of the present invention.

FIG. 29 is a block diagram of the configuration of the hardware environment of the HDL data structure analysis system 100 according to the first through third embodiments of the present invention. In FIG. 29, the HDL data structure analysis system 100 is configured by a control device (CPU) 52, read only memory (ROM) 53, random access memory (RAM) 56, a communication interface (hereinafter an interface is referred to as an I/F) 54, a storage device 57, an output I/F 51, an input I/F 55, a reading device 58 of a portable storage medium, and a bus 59 connecting all of the above-mentioned components, an output device 60 connected to the output I/F 51, and an input device 61 connected to the input I/F 55.

The storage device 57 can be various storage devices such as a hard disk, a magnetic disk, etc. The storage device 57 or ROM 53 stores of the flow used in the first through third embodiments. The storage device 57 can store the HDL design and TCL software according to the fist through third embodiments. Additionally, the storage device 57 can store a structured analyzing DB or logical composition rule.

The above-mentioned program can be stored in, for example, the storage device 57 through a network 62 and the communication interface 54 from a program provider, or stored in a marketed portable storage medium, set in the reading device 58, and executed by the CPU 52. A portable storage medium can be various types of storage media such as CD-ROM, a flexible disk, an optical disk, a magneto-optical disk, an IC card, etc., and a program stored in any of these storage medium is read by the reading device 58.

The input device 61 can be, a keyboard, a mouse, or an electric camera, a microphone, a scanner, a sensor, a tablet, etc. The output device 60 can be a display, a printer, a printer, a speaker, etc. The network 62 can be a communication network such as the Internet, a LAN, a WAN, a dedicated line, a cable, wireless, etc.

As described above, according to the present invention, a design product can be efficiently analyzed relating to the circuit design using a hardware description language.

What is claimed is:

1. A computer readable storage medium for storing a structure analytic program used to direct a computer to perform a process of analyzing a structure of a circuit of circuit design data relating to the circuit configured by a plurality of elements of a circuit described in a hardware description language, comprising:

an acquiring process of obtaining the circuit design data;

a database structuring process of structuring a structure analyzing database based on the circuit design data;

a database replicating process of replicating the structure analyzing database;

an element deleting process of deleting a predetermined element in the elements configuring the circuit indicated by the replicate database from the replicate database that is the replicated structure analyzing database; and a structure analyzing process of performing the structure analysis on the replicate database from which the element is deleted in the element deleting process, wherein the element deleting process performs a process of deleting the element depending on a type of structure analyzing process performed in the structure analyzing process, to dynamically generate a structure analyzing database specialized for each type of structure analyzing process.

2. The computer readable storage medium according to claim 1, wherein when the structure analyzing process performs asynchronous path retrieval, the element deleting process performs a process of deleting the element other than a register to which a clock signal line or a data signal line is connected.

3. The computer readable storage medium according to claim 1, wherein when the structure analyzing process performs inter-block signal information extraction, the element deleting process performs a process of deleting the element other than the element relating to a connection between blocks that are a type of the element.

4. The computer readable storage medium according to claim 1, further comprising:

an element replacing process of replacing a dummy module with a normal module in the structure analyzing database in which a portion not designed yet in the circuit design data is structured as a dummy module.

5. A computer readable storage medium for storing a structure analytic program used to direct a computer to perform process of analyzing a structure of a circuit of circuit design data relating to the circuit configured by a plurality of elements of a circuit described in a hardware description language, comprising:

an acquiring process of obtaining the circuit design data;

a database structuring process of structuring a structure analyzing database based on the circuit design data;

a database replicating process of replicating the structure analyzing database;

an element deleting process of deleting a predetermined element in the elements configuring the circuit indicated by the replicate database from the replicate database that is the replicated structure analyzing database;

a structure analyzing process of performing the structure analysis on the replicate database from which the element is deleted in the element deleting process; and a logical composition rule element generating process of generating the element based on the logical composition rule, and reflecting the element by the circuit design data or the analyzing DB, and wherein the acquiring process further obtains a logical composition rule describing a rule for logical composition.

6. The computer readable storage medium according to claim 5, wherein the logical composition rule element generating process comprises:

a determining process of determining whether or not there is the element matching a condition described in the logical composition rule in the circuit design data or the replicate database; and a generating process of generating a logical composition rule element based on the logical composition rule, and converting an element obtained by determination in the determining process to the logical composition rule element.

7. The computer readable storage medium according to claim 5, wherein the logical composition rule is generated in a script language.

8. A structure analytic apparatus for analyzing a structure of a circuit of circuit design data relating to the circuit configured by a plurality of elements of a circuit described in a hardware description language, comprising:

an acquisition unit for obtaining the circuit design data;

a database structure unit for structuring a structure analyzing database based on the circuit design data;

a database replicate unit for replicating the structure analyzing database;

an element deletion unit for deleting a predetermined element in the elements configuring the circuit indicated by the replicate database from the replicate database that is the replicated structure analyzing database; and a structure analysis unit for performing the structure analysis on the replicate database from which the element is deleted in the element deleting process, wherein the element deletion unit deletes the element depending on a type of structure analysis performed by the structure analysis unit, to dynamically generate a structure analysis database specialized for each type of structure analysis.

9. The structure analytic apparatus according to claim 8, wherein when the structure analysis unit performs asynchronous path retrieval, the element deletion unit deletes the element other than a register to which a clock signal line or a data signal line is connected.

10. The structure analytic apparatus according to claim 8, wherein when the structure analysis unit performs inter-block signal information extraction, the element deletion unit deletes an element other than the element relating to a connection between blocks which is a type of the element.

11. The structure analytic apparatus according to claim 8, further comprising:

an element replacement unit for replacing a dummy module with a normal module in the structure analyzing database in which a portion not designed yet in the circuit design data is structured as the dummy module.

12. A structure analytic apparatus for analyzing a structure of a circuit of circuit design data relating to the circuit configured by a plurality of elements of a circuit described in a hardware description language, comprising:

an acquisition unit for obtaining the circuit design data;
a database structure unit for structuring a structure analyzing database based on the circuit design data;
a database replicate unit for replicating the structure analyzing database;
an element deletion unit for deleting a predetermined element in the elements configuring the circuit indicated by the replicate database from the replicate database that is the replicated structure analyzing database; and
a structure analysis unit for performing the structure analysis on the replicate database from which the element is deleted in the element deleting process, wherein:
the acquisition unit further obtains a logical composition rule in which a rule for logical composition is described; and
the structure analytic apparatus further comprises:
a logical composition rule element generation unit for generating the element based on the logical composition rule and reflecting the element by the circuit design data or the analyzing DB.

13. The structure analytic apparatus according to claim 12, wherein the logical composition rule element generation unit comprises:

a determination unit for determining whether or not there is the element matching a condition described in the logical composition rule in the circuit design data or the replicate database; and a generation unit for generating a logical composition rule element which is an element based on the logical composition rule, and converting an element obtained by determination by the determination unit to the logical composition rule element.

14. The structure analytic apparatus according to claim 12, wherein the logical composition rule is generated in a script language.

15. A computer readable storage medium for storing a structure analytic program used to direct a computer to perform process of analyzing a structure of a circuit of circuit design data relating to the circuit configured by a plurality of elements of a circuit described in a hardware description language, comprising:

an acquiring process of obtaining the circuit design data;
a determination process determining whether or not the obtained circuit design data includes a portion not yet designed;
a dummy module generating process of generating the portion not yet designed as a dummy module when the obtained circuit design data includes a portion not yet designed;
a first database structuring process of structuring a structure analyzing database based on the circuit design data in the dummy module generating process;
an element replacing process replacing the dummy module with a normal module whose design is complete; and
a second database structuring process of structuring a structure analyzing database based on the replacing module; and
a structure analyzing process of performing the structure analysis on the analyzing DB.

* * * * *